US012649194B2

(12) United States Patent (10) Patent No.: US 12,649,194 B2
Wong et al. (45) Date of Patent: Jun. 9, 2026

(54) REFLOW METHOD AND SYSTEM

(71) Applicant: Taiwan Semiconductor Manufacturing Company, Ltd., Hsinchu (TW)

(72) Inventors: Cheng-Shiuan Wong, Hsinchu (TW);
Ching-Hua Hsieh, Hsinchu (TW);
Hsiu-Jen Lin, Hsinchu County (TW);
Hao-Jan Pei, Hsinchu (TW);
Hsuan-Ting Kuo, Taichung City (TW);
Wei-Yu Chen, Taipei City (TW);
Chia-Shen Cheng, Hsinchu County
(TW); Philip Yu-Shuan Chung, Taipei
(TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/940,797

(22) Filed: Nov. 7, 2024

(65) Prior Publication Data

US 2025/0070077 A1 Feb. 27, 2025

Related U.S. Application Data

(60) Continuation of application No. 18/172,988, filed on Feb. 22, 2023, now Pat. No. 12,176,319, which is a
(Continued)

(51) Int. Cl.
B23K 1/00 (2006.01)
B23K 1/008 (2006.01)
(Continued)

(52) U.S. Cl.
CPC .......... B23K 1/008 (2013.01); *B23K 2101/40* (2018.08); *H10W 72/07141* (2026.01); *H10W 72/07183* (2026.01); *H10W 72/07236* (2026.01)

(58) Field of Classification Search
CPC .............. H05K 13/0409; B23K 1/0016; B23K 2101/40; B23K 2101/42; B23K 3/0638;
(Continued)

(56) References Cited

U.S. PATENT DOCUMENTS 4,779,565 A * 10/1988 Young ................... H01L 21/486
118/712
4,795,518 A * 1/1989 Meinel ................ H01L 21/6838
269/21
(Continued)

*Primary Examiner* — Erin B Saad
(74) *Attorney, Agent, or Firm* — JCIPRNET

(57) ABSTRACT

A system for reflowing a semiconductor workpiece including a stage, a first vacuum module and a second vacuum module, and an energy source is provided. The stage includes a base and a protrusion connected to the base, the stage is movable along a height direction of the stage relative to the semiconductor workpiece, the protrusion operably holds and heats the semiconductor workpiece, and the protrusion includes a first portion and a second portion surrounded by and spatially separated from the first portion. The first vacuum module and the second vacuum module respectively coupled to the first portion and the second portion of the protrusion, and the first vacuum module and the second vacuum module are operable to respectively apply a pressure to the first portion and the second portion. The energy source is disposed over the stage to heat the semiconductor workpiece held by the protrusion of the stage.

20 Claims, 17 Drawing Sheets

Related U.S. Application Data division of application No. 17/080,842, filed on Oct. 27, 2020, now Pat. No. 11,610,859.

(51) Int. Cl.
| | | |
|---|---|---|
| *B23K 101/40* | (2006.01) | |
| *H10W 72/00* | (2026.01) | |

(58) Field of Classification Search
CPC ........ B23K 1/008; B23K 1/018; B23K 1/203;
B23K 1/206; B23K 20/023; B23K
2101/36; B23K 3/0607; B23K 3/0623;
B23K 31/02
See application file for complete search history.

(56) References Cited

U.S. PATENT DOCUMENTS

| | | | | | |
|---|---|---|---|---|---|
| 4,832,250 | A | * | 5/1989 | Spigarelli | H05K 13/0486 |
| | | | | | 228/19 |
| 5,409,543 | A | * | 4/1995 | Panitz | C23G 5/00 |
| | | | | | 228/205 |
| 5,749,999 | A | * | 5/1998 | Dandia | H01L 21/6838 |
| | | | | | 269/21 |
| 6,793,756 | B2 | * | 9/2004 | Lee | B32B 37/10 |
| | | | | | 156/228 |
| 7,629,231 | B2 | * | 12/2009 | Maki | H01L 24/83 |
| | | | | | 438/464 |
| 10,205,133 | B2 | * | 2/2019 | Sun | H01L 21/67121 |
| 2011/0079632 | A1 | * | 4/2011 | Chey | B23K 3/0638 |
| | | | | | 228/33 |
| 2012/0244273 | A1 | * | 9/2012 | Levy | H05K 3/0079 |
| | | | | | 118/712 |
| 2013/0133936 | A1 | * | 5/2013 | Yorita | H05K 3/3478 |
| | | | | | 228/175 |
| 2013/0177698 | A1 | * | 7/2013 | Cherbis | H05K 3/22 |
| | | | | | 118/696 |
| 2013/0260534 | A1 | * | 10/2013 | Khanna | H01L 24/75 |
| | | | | | 438/457 |
| 2014/0182761 | A1 | * | 7/2014 | Hayashi | H01L 21/6838 |
| | | | | | 156/60 |
| 2019/0254174 | A1 | * | 8/2019 | Tanaka | H05K 13/0409 |
| 2022/0130795 | A1 | * | 4/2022 | Wong | B23K 37/0443 |
| 2022/0238480 | A1 | * | 7/2022 | Zhan | H01L 24/16 |

* cited by examiner

REFLOW METHOD AND SYSTEM

CROSS-REFERENCE TO RELATED APPLICATION

This application is a continuation application of and claims the priority benefits of a prior U.S. application Ser. No. 18/172,988, filed on Feb. 22, 2023 and now allowed. The prior U.S. application Ser. No. 18/172,988 is a divisional application of and claims the priority benefit of U.S. patent application Ser. No. 17/080,842, filed on Oct. 27, 2022 and now allowed. The entirety of each of the above-mentioned patent applications is hereby incorporated by reference herein and made a part of this specification.

BACKGROUND

In some methods for manufacturing semiconductor packages, integrated circuits are initially formed on semiconductor wafers, which are then sawed into semiconductor dies. Those semiconductor dies may be subsequently attached onto a package substrate. For example, the solder bumps between the semiconductor dies and the package substrate are reflowed to provide electrical connection between the semiconductor dies and the package substrate. Since the package substrates and the overlying semiconductor dies have different coefficients of thermal expansion (CTEs), the warpage in the semiconductor dies and the package substrate is worsened and causes cold joint issue during the reflow. Accordingly, there is continuous effort in developing new mechanisms of controlling warpage behavior during the reflow to form semiconductor packages with better performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
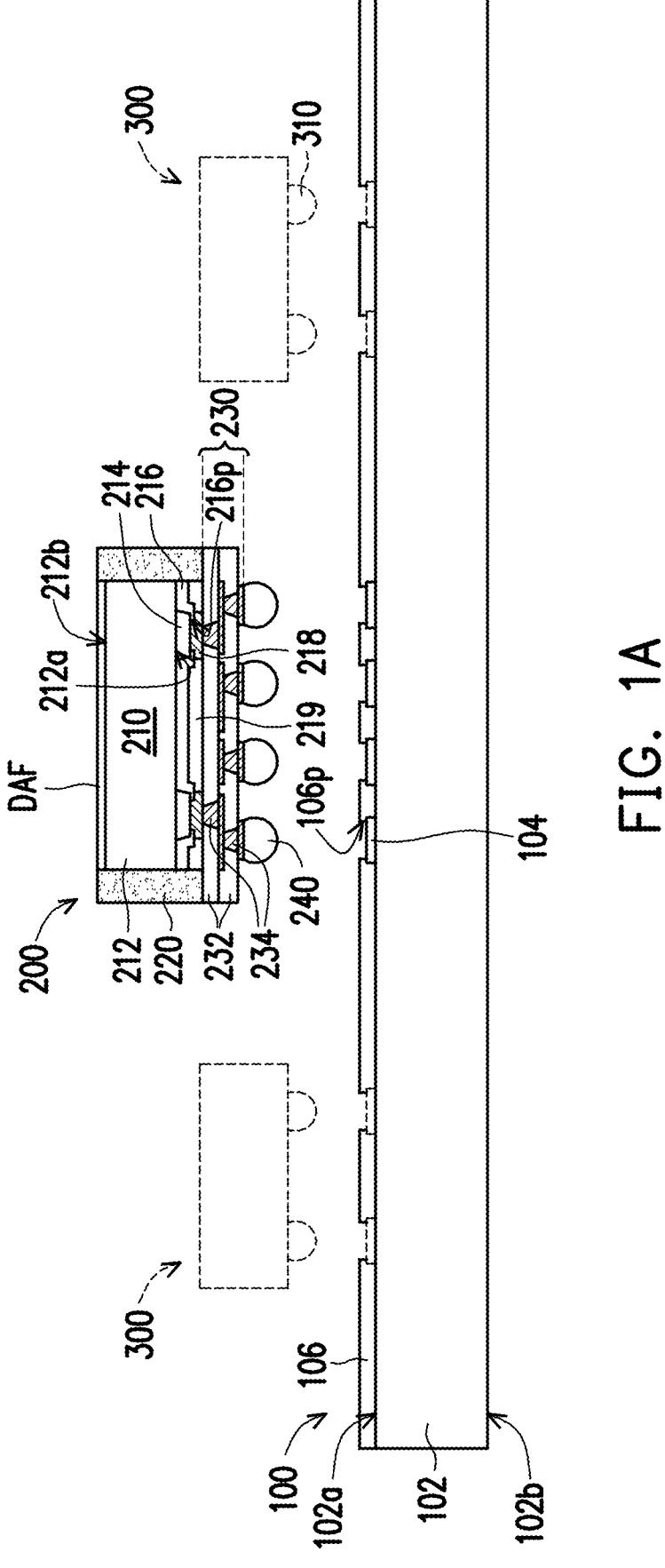
FIGS. 1A-1C are schematic cross-sectional view of forming a package structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
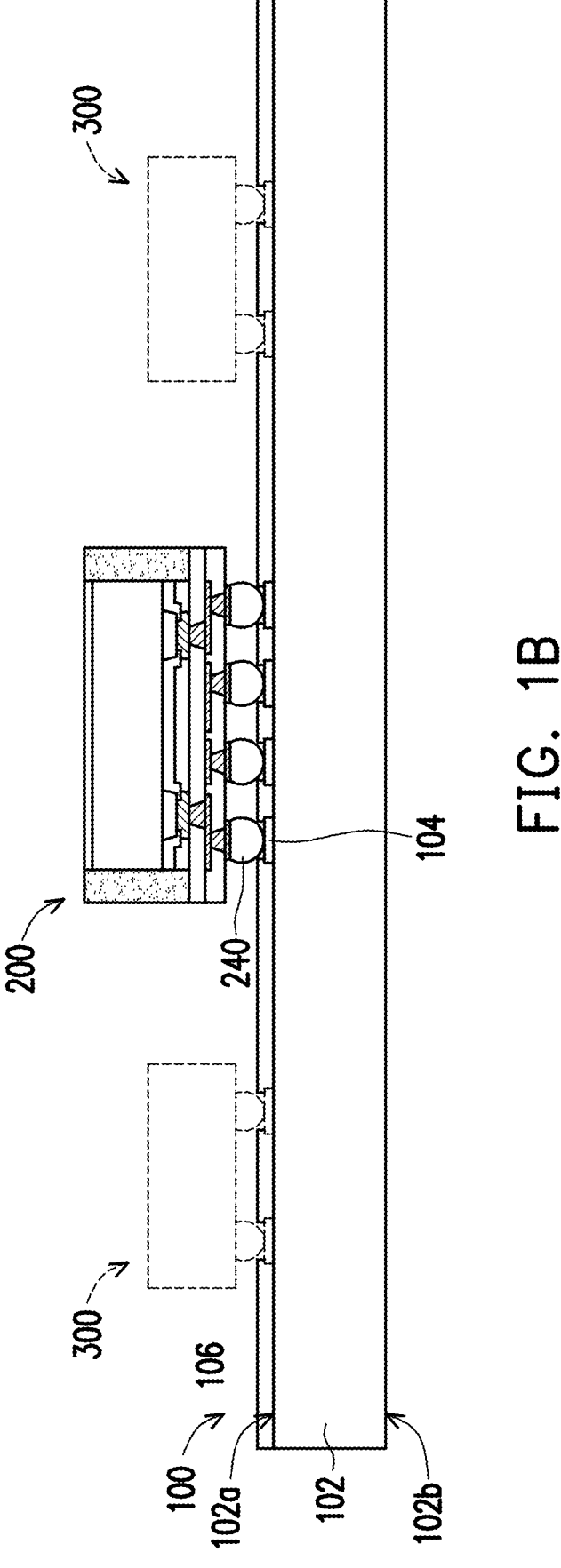
Figure 1C:
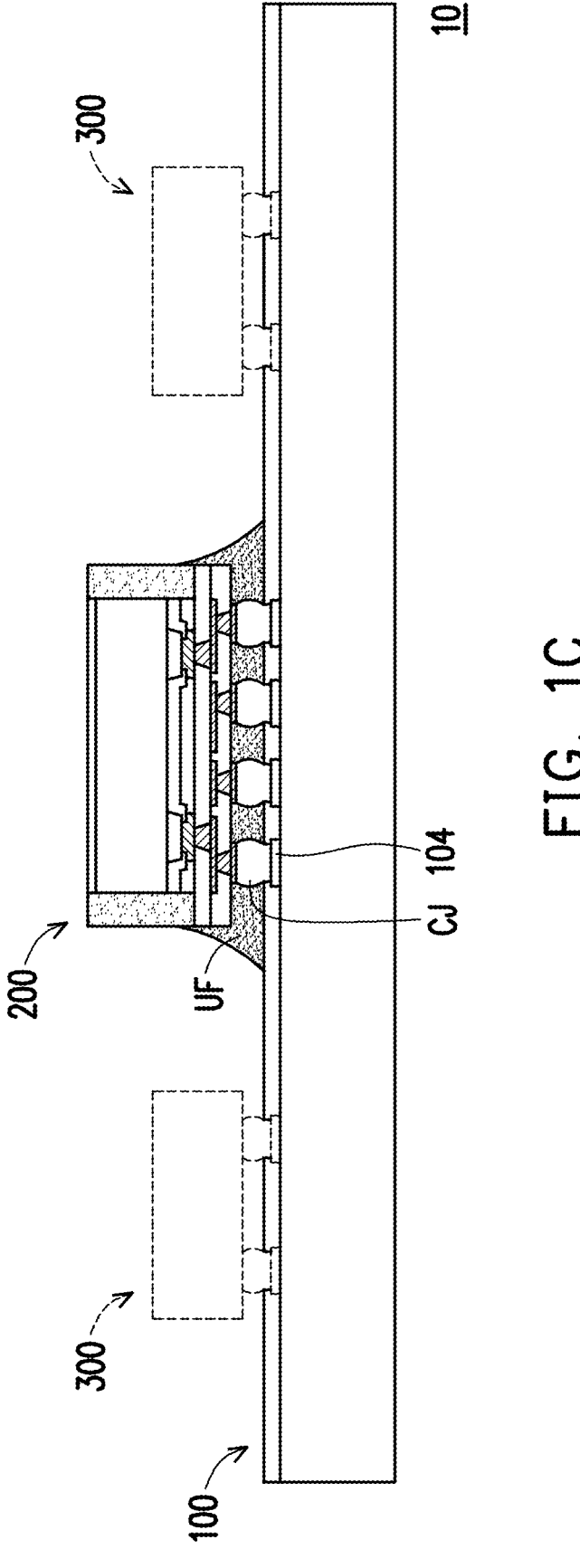
Figure 2:
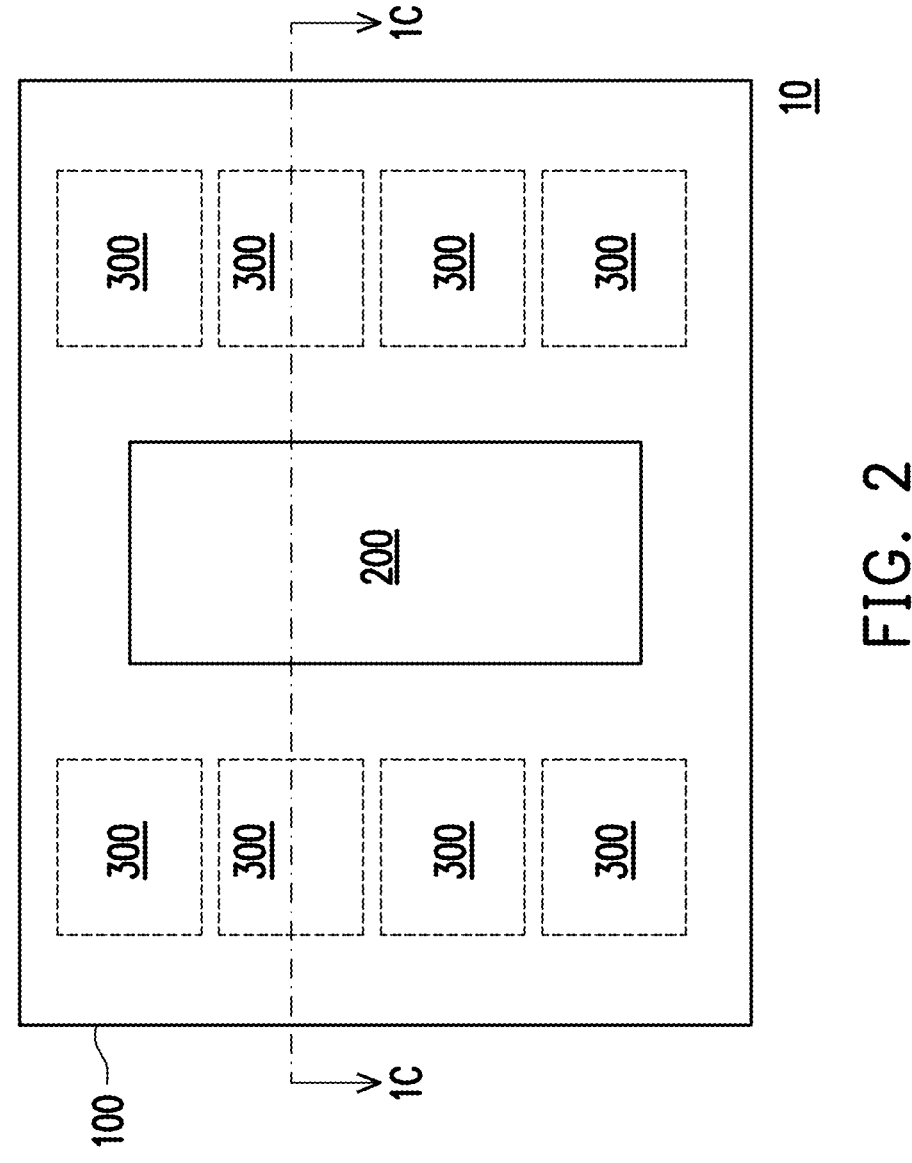
FIG. 2 is a schematic top view of a package structure according to some embodiments.

FIGS. 1A-1C are schematic cross-sectional view of forming a package structure according to some embodiments and FIG. 2 is a schematic top view of a package structure according to some embodiments, where FIG. 1C may be a schematic cross-sectional view of a package structure as taken along line 1C-1C of FIG. 2. Referring to FIGS. 1A, a first package component 100 and a second package component 200 component are respectively provided. Third package component(s) 300 may be optionally provided, and thus the third package components 300 are illustrated in dashed lines to indicate they may be or may not be present. It is appreciated that the embodiments such as what are shown in FIGS. 1-2 are merely examples, and more embodiments may be developed.

The first package component 100 may be or may include an interposer, a package substrate, a printed circuit board (PCB), a printed wiring board, a mother board, and/or other carrier that is capable of carrying integrated circuits. For example, the first package component 100 includes a laminate substrate, which includes a plurality of dielectric films laminated together. In some embodiments, the first package component 100 includes a semiconductor substrate 102 having a top surface 102a and a bottom surface 102b, a plurality of contact pads 104 disposed over the top surface 102a of the semiconductor substrate 102, and an insulating layer 106 disposed over the top surface 102a of the semiconductor substrate 102 and partially covering the contact pads 104.

The semiconductor substrate 102 may include a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 102 includes an elementary semiconductor (e.g., silicon or germanium in a crystalline, a polycrystalline, or an amorphous structure, etc.), a compound semiconductor (e.g., SiC, GaAs, GaP, InP, InAs, etc.), an alloy semiconductor (e.g., SiGe, GaAsP, AllnAs, AlGaAs, GalnAs, GalnP, etc.), combinations thereof, or other suitable materials. The semiconductor substrate 102 may include the semiconductor devices (not shown) formed therein or thereon, and the semiconductor devices may be or may include active devices (e.g., transistors, diodes, etc.) and/or passive devices (e.g., capacitors, resistors, inductors, etc.), or other suitable electrical components. Alternatively, the semiconductor substrate 102 is free of active and/or passive devices formed therein. In some embodiments, the semiconductor substrate 102 is a multiple layer circuit board including bismaleimide triazine (BT) resin, FR-4, ceramic, glass, plastic, or other supporting materials that may carry the contact pads.

In some embodiments, the contact pads 104 are disposed at the region where the second package component 200 (and/or the third package component 300) will be bonded to the first package component 100. It is understood that a few contact pads 104 are shown in FIGS. 1A-1C; alternatively, dozens or more contact pads may be arranged. The material of the contact pads 104 may include aluminum, copper, silver, gold, nickel, tungsten, alloys thereof, and/or multilayers thereof. The insulating layer 106 may include openings 106p accessibly revealing at least a portion of the corresponding contact pads 104 for further electrical connection. In some embodiments, the insulating layer 106 is a solder resist layer having openings for solder jointing. The insulating layer 106 may be a polymer layer or may include suitable materials that may prevent solder from bridging between conductors. Additional package features (e.g., one or more redistribution layers (RDLs) disposed between and electrically connecting the semiconductor substrate 102 and the contact pads 104, through substrate vias (TSVs) penetrating through the semiconductor substrate 102, and/or external terminals disposed on the side of the semiconductor substrate 102 opposite to the contact pads 104, etc.) may be formed in the first package component 100.

Continue to FIG. 1A, the second package component 200 may be an integrated fan-out (InFO) package in accordance with some embodiments. For example, the second package component 200 includes a semiconductor die 210, an insulating encapsulation 220 covering the semiconductor die 210, a redistribution structure 230 disposed on the semiconductor die 210 and the insulating encapsulation 220, and a plurality of conductive terminals 240 disposed on the redistribution structure 230 opposite to the semiconductor die 210. The semiconductor die 210 may be electrically coupled to the conductive terminals 240 through the redistribution structure 230. Additional package features (e.g., through insulator vias (TIVs) penetrating through the insulating encapsulation 220, backside redistribution structure disposed on the semiconductor die 210 and the insulating encapsulation 220 and located opposite to the redistribution structure 230, etc.) may be formed in the second package component 200.

The semiconductor die 210 may be formed in a semiconductor wafer (not shown), which may include different die regions that are singulated to form a plurality of the semiconductor dies 210. The semiconductor die 210 may be a logic die (e.g., central processing module (CPU), graphics processing module (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. Note that, a single semiconductor die 210 is presented for illustrative purposes; however, the number of the semiconductor die packaged in the insulating encapsulation 220 may be one or more than one, the disclosure is not limited thereto.

In some embodiments, the semiconductor die 210 includes a semiconductor substrate 212, a plurality of conductive pads 214 disposed over a front side 212a of the semiconductor substrate 212, a passivation layer 216 disposed over the front side 212a of the semiconductor substrate 212 and having openings 216p accessibly revealing portions of the conductive pads 214, a plurality of conductive bumps 218 disposed in the openings 216p of the passivation layer 216 and disposed on the conductive pads 214, and a protection layer 219 optionally disposed on the passivation layer 216 and laterally covering the conductive bumps 218. In some embodiments, the semiconductor die 210 is provided with a die attach film DAF on a back side 212b of the semiconductor substrate 212. Alternatively, the die attach film DAF is omitted.

For example, the semiconductor substrate 212 includes a bulk silicon substrate, although it may include other semiconductor materials, such as group III, group IV, and/or group V elements. In some embodiments, semiconductor devices (not shown; such as transistors, diodes, resistors, capacitors, etc.) are formed in the semiconductor substrate 212. In some embodiments, an interconnect structure (not shown; e.g., inter-layer dielectrics (ILDs) and inter-metal dielectrics (IMDs)), which includes metal lines and vias formed on the front side 212a of the semiconductor substrate 212. The conductive pads 214 may be electrically coupled to the semiconductor devices through the interconnect structure. The material of the conductive pads 214 may include aluminum, but other suitable conductive material (e.g., copper) may be used. The passivation layer 216 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The conductive bumps 218 may be or may include copper pillars, copper alloy pillars, or other suitable metallic pillars. In some embodiments, the respective conductive bump 218 includes lead-based materials or lead-free materials with or without additional impurity formed on the top, but is not limited thereto. The protection layer 146 may be made of a polybenzoxazole (PBO) layer, a polyimide (PI) layer, a benzocyclobuten (BCB) layer, or suitable polymers or inorganic materials to prevent possible damage(s) occurring on the conductive bumps 218. It should be appreciated that the illustration of the semiconductor die 210 in FIGS. 1-2 is schematic and is not in scale.

The insulating encapsulation 220 may extend along the sidewalls of the semiconductor die 210 for protection. The material of the insulating encapsulation 220 may be or may include a molding compound, a molding underfill, a resin (e.g., epoxy), or the like. The surfaces of the insulating encapsulation 220 and the semiconductor die 210 where the redistribution structure 230 is to be formed thereon may be substantially leveled. The redistribution structure 230 may include one or more dielectric layers 232 formed over surfaces of the semiconductor die 210 and the insulating encapsulation 220. The material of the dielectric layers 232 may include PI, PBO, BCB, combinations thereof, etc. The redistribution structure 230 may also include conductive features 234 (e.g., conductive lines, pads, and/or vias) formed within the dielectric layers 232 and electrically coupled to the conductive terminals 240 and the conductive bumps 218 of the semiconductor die 210. The redistribution structure 230 may be referred to as a front side redistribution structure given its placement in the second package component 200.

In some embodiments, the conductive terminals 240 are made of a conductive material with low resistivity, such as Sn, Ag, Cu, Pb, Ni, Ge, Bi and the arbitrary combination thereof. The conductive terminals 240 may be ball grid array (BGA) connectors, solder balls, metal pillars, or the like. For example, the conductive terminals 240 are formed by initially forming a layer of solder through methods such as ball drop, evaporation, electroplating, printing, dispensing, or the like. The conductive terminals 240 may be referred to as solder bumps in accordance with some embodiments. In some embodiments, the contact pads 104 of the first package component 100 are adapted to be coupled to the conductive terminals 240 of the second package component 200 and may include a similar pattern as the distribution of conductive terminals 240.

It is noted that the second package component 200 illustrated herein as the InFO package is merely an example. The second package component 200 may be or may include a Package-On-Package (POP) device, a stacked-die device, a systems-on-chip device, a wafer level package (WLP) device, a chip scale package, other types of devices, and/or combinations thereof in accordance with some embodiments. It is also noted that only one second package component 200 is shown; however, a plurality of second package component 200 may be attached to the first package component 100.

In some embodiments, the third package components 300 are provided and to be mounted onto the first package component 100. The third package components 300 may perform a same or different function as the second package component 200. The third package components 300 may be or may include surface mount devices (SMDs), integrated passive devices (IPDs), or a combination thereof, etc. In some embodiments, the respective third package component 300 is provided with solder connectors 310. Alternatively, the respective third package component 300 is attached between adjacent contact pads 104 using solder after the third package components 300 are placed over the first package component 100. For example, the third package components 300 are electrically coupled to the second package component 200 through the first package component 100 after bonding the second package component 200 and the third package components 300 to the first package component 100. It is noted that the number of the third package component 300 shown in the drawings is merely an example, fewer or additional third package components 300 may be attached to the first package component 100.

With continued reference to FIG. 1A and further referencing FIGS. 1B-1C, the second package component 200 may be picked and placed on the first package component 100. For example, the conductive terminals 240 of the second package component 200 are placed over the contact pads 104 of the first package components 110 with a one-to-one correspondence. Next, the second package component 200 may be bonded onto the first package component 100 to form the package structure 10. For example, a reflow process is performed to melt the conductive terminals 240 (e.g., solder bumps) so as to form conductive joints CJ (labeled in FIG. 1C) that interconnect the second package component 200 and the first package component 100. In some embodiments, after the bonding, an underfill layer UF is formed in the gap between the first package component 100 and the second package component 200 to surround the conductive joints CJ for protection. Alternatively, the underfill layer UF may be omitted.

In some embodiments, the third package components 300 are also picked and placed over the first package component 100 next to the second package component 200. Subsequently, the third package components 300 may be bonded to the first package component 100 through solder bonding at the step of bonding the second package component 200 to form the package structure 10. Alternatively, the third package components 300 may be bonded to the first package component 100 before/after bonding the second package component 200 to the first package component 100. In some embodiments, after the bonding, the third package components 300 are arranged in a column at two opposing sides of the second package component 200 in the top view as shown in FIG. 2. For example, the second package component 200 is arranged at the central region of the first package component 100 and the third package components 300 are distributed at the peripheral region of the first package component 100, although other configurations are possible. In some embodiments, in the top view, the second package component 200 have a rectangular shape, although other general shape such as the square/rounded/polygonal shape may be used.

In some embodiments, the first package component 100 and/or the second package component 200 may have natural warpage. During the bonding, the warpage may be worsened due to elevated temperatures. In addition, warpage behavior of the first package component 100 and the second package component 200 may mismatch, so that distances between these two package components may vary in different areas of the bonding surfaces. Therefore, the warpage in the package components may cause cold joints and/or bump cracks. In other aspects, to perform the reflow process, the workpiece to be reflowed (e.g., the structure shown in FIG. 1B) may be placed over a vacuum stage, and a downward force may be applied to the first package component 100 due to the air pressure caused by the vacuum. The second package component 200 placed on the first package component 100 may shift due to a sudden change of the air pressure caused by the vacuum, thereby decreasing joint reliability. Methods and process system for bonding package components discussed below may provide warpage behavior control during the reflow process and may eliminate the issues mentioned above.

Figure 3:
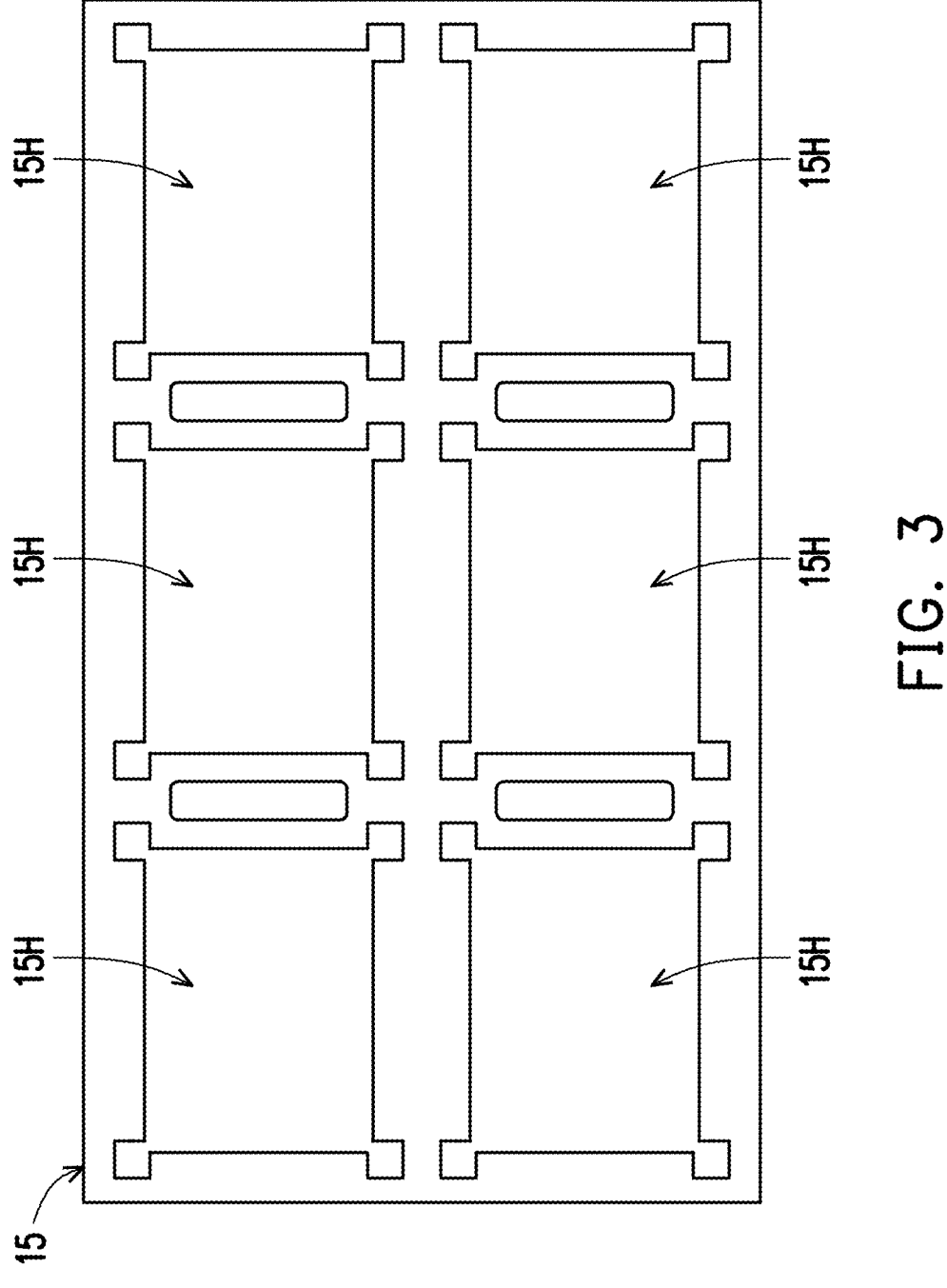
FIG. 3 is a schematic top view of a carrier according to some embodiments.
Figure 4:
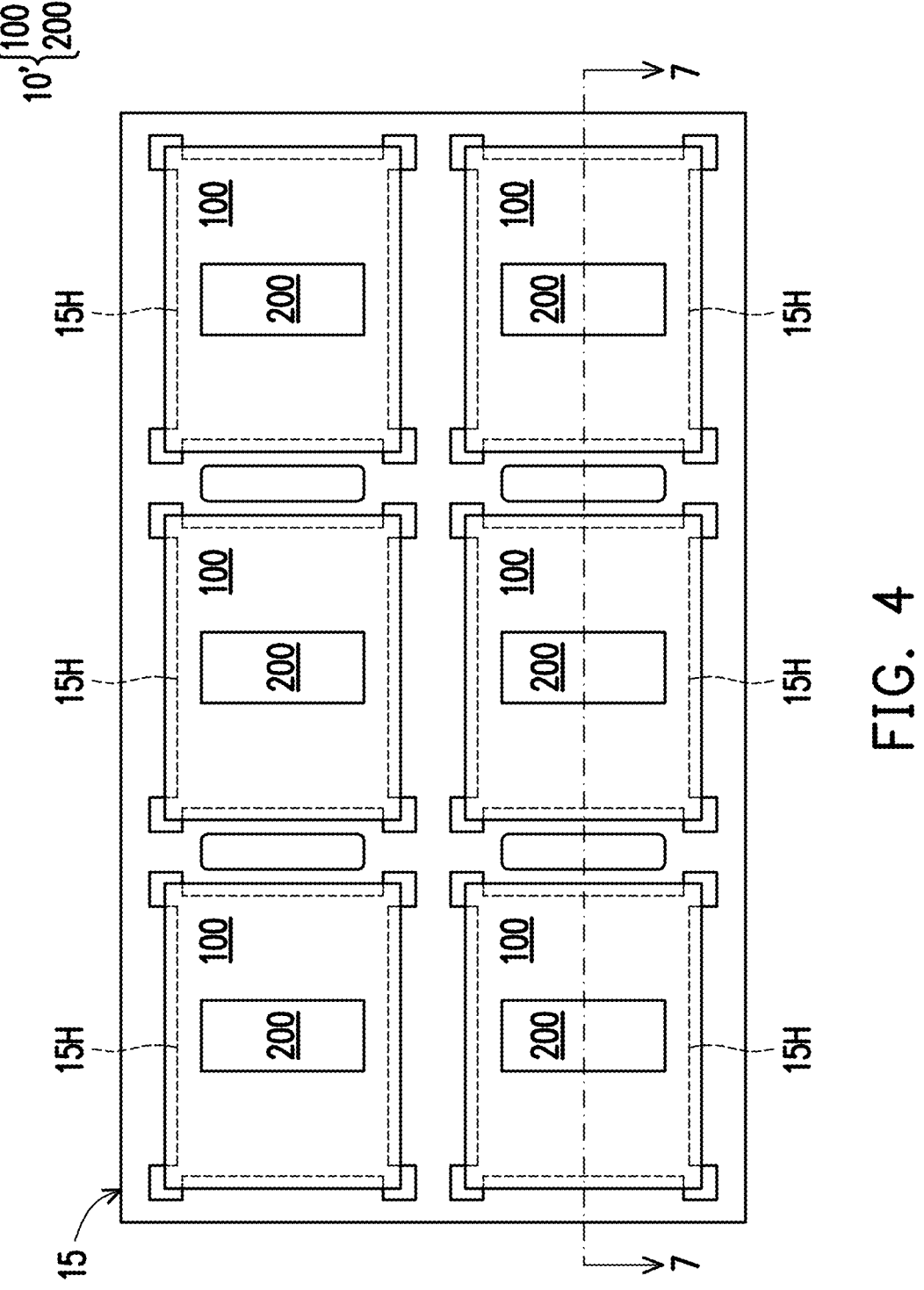
FIG. 4 is a schematic top view of package components disposed on a carrier according to some embodiments.

FIG. 3 is a schematic top view of a carrier according to some embodiments, and FIG. 4 is a schematic top view of package components disposed on a carrier according to some embodiments. Referring to FIG. 3, a carrier 15 for carrying a plurality of workpieces to be processed is provided. The carrier 15 may be formed of dielectric material, metal, or any suitable material that is rigid enough to carry the workpieces during processing. The carrier 15 may be referred to a supporting boat in accordance with some embodiments. In some embodiments, the carrier 15 has a rectangular shape, although other shape (e.g., the rounded shape or the like) may also be used. In some embodiments, the carrier 15 includes a plurality of hollow regions 15H extending from the top side to the bottom side of the carrier 15. The hollow regions 15H may be distributed throughout the carrier 15 in an array. Although six hollow regions 15H are illustrated in FIG. 3, the carrier 15 may have any number of rows and columns of the hollow regions 15H. The size of each of the hollow regions 15H may be great enough to allow the first package component 100 of the workpiece (shown in FIG. 1B) to at least partially expose through.

Referring to FIG. 4 and with continued reference to FIGS. 1B and 2-3, a plurality of workpieces 10' to be processed may be disposed on the carrier 15. For example, the respective workpiece 10' is the structure having the second package component 200 placed on the first package component as shown in FIG. 1B. It is noted that the third package component 300 is not shown in FIG. 4; however, as mentioned in preceding paragraphs, the third package components 300 may be disposed on the first package component 100 and aside the second package component 200, if desired. In some embodiments, a batch of the workpieces 10' is placed over the hollow regions 15H of the carrier 15 with a one-to-one correspondence. Although six workpieces 10' are illustrated in FIG. 4, the carrier 15 may have any number of the workpieces 10' placed thereon to be processed.

For example, the respective workpiece 10' partially overlaps the hollow region 15H. In some embodiment, the respective workpiece 10' has at least a portion accessibly exposed by the corresponding hollow region 15H. The hollow region 15H may reveal the central portion of the bottom surface 102b of the first package component 100 (labeled in FIG. 1B), and the periphery of the bottom surface 102b may be at least partially in physical contact with the carrier 15 for adequate mechanical support. After placing the workpieces 10' on the carrier 15, the workpieces 10' may be transferred to perform a reflow process in accordance with some embodiments. The details of operations will be discussed later in accompanying with FIGS. 7A-7F.

Figure 5:
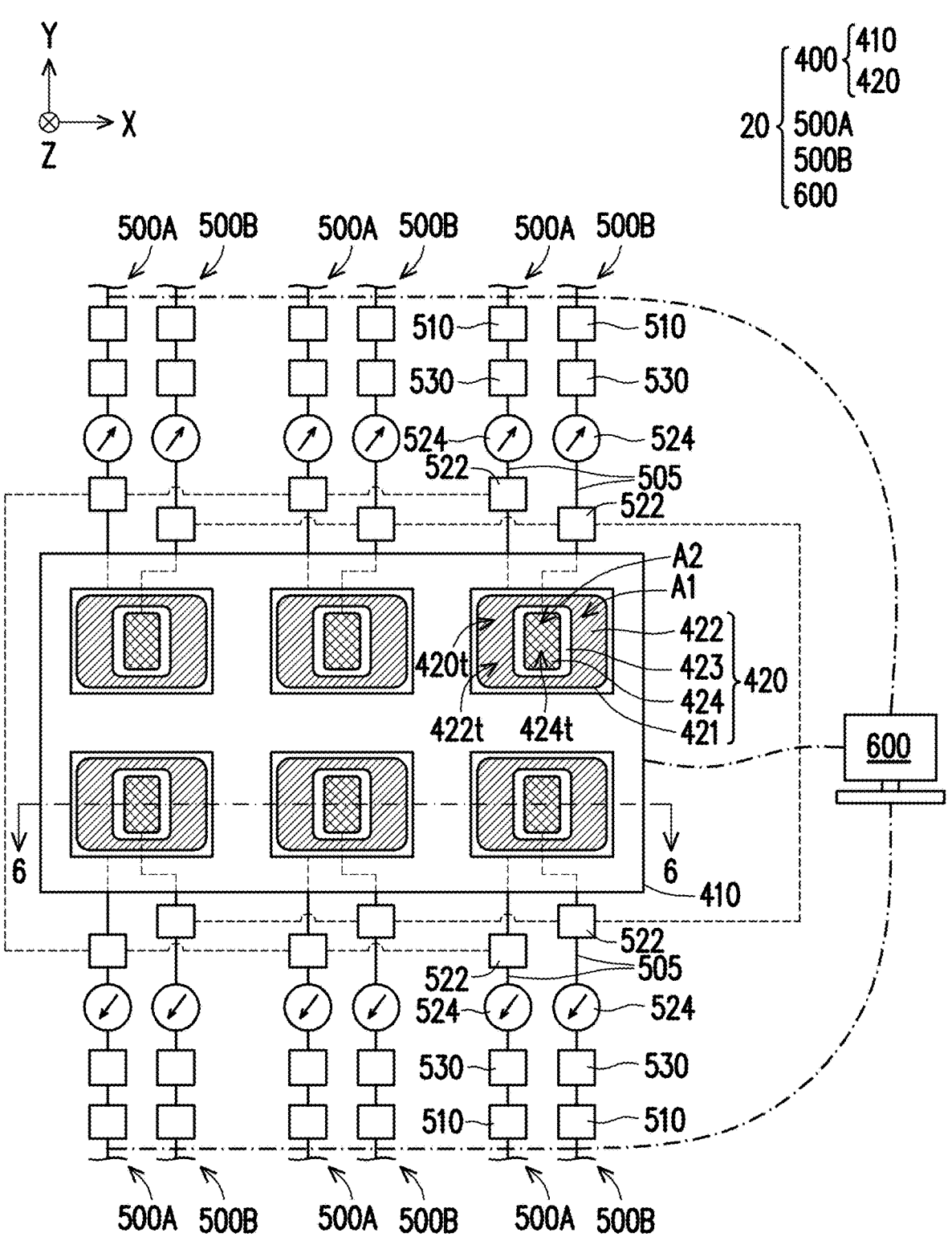
FIG. 5 is a schematic top view of a portion of a process tool according to some embodiments.
Figure 6:
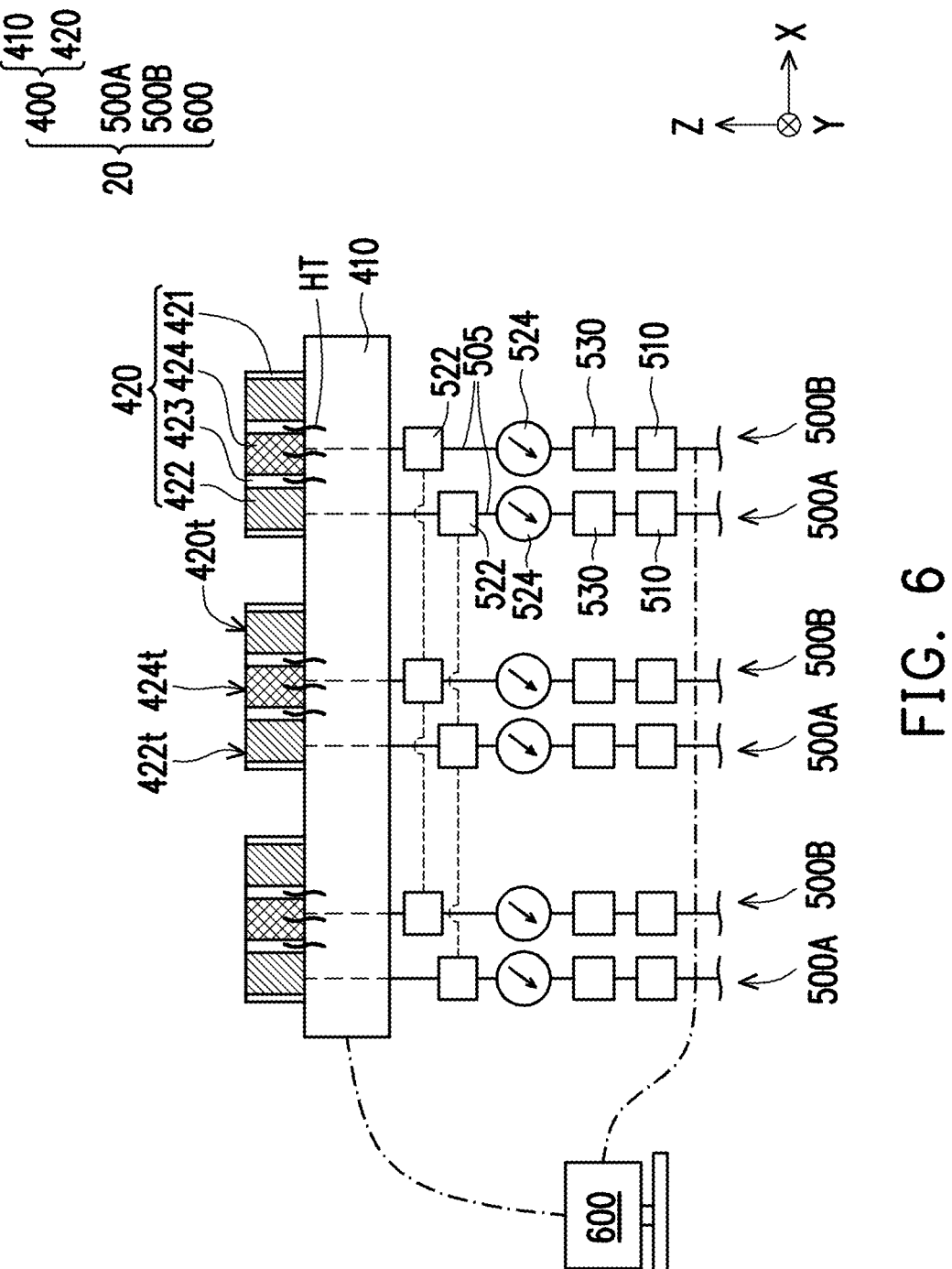
FIG. 6 is a schematic cross-sectional view of a portion of a process tool as taken along line 6-6 of FIG. 5 according to some embodiments.

FIG. 5 is a schematic top view of a portion of a process tool according to some embodiments and FIG. 6 is a schematic cross-sectional view of a portion of a process tool as taken along line 6-6 of FIG. 5 according to some embodiments. Referring to FIGS. 5-6, a process tool 20 includes a stage 400 and at least one vacuum module (e.g., 500A, 500B) operably coupled to the stage 400. The process tool 20 may include at least one operating device 600 controllably operating the stage 400 and the vacuum module(s). For example, the operating device 600 includes a controller, a user interface, a network interface, a computer readable storage module (e.g., a memory and/or data store), and other suitable component(s) for performing various processes/operations discussed herein. The process tool 20 configured to perform a reflow process may be referred to a reflow tool.

In some embodiments, the stage 400 is configured to hold the workpieces during processing. The stage 400 may be movable along a height direction (e.g., Z direction) of the stage 400 to move close to or away from the workpieces. It is noted that the stage 400 in FIGS. 5-6 are illustrated in a simplified manner and additional elements may be equipped within the stage 400. For example, the stage 400 includes driving devices (e.g., shafts, gears, motors, etc.; not shown) to make the movement/alignment of the workpieces possible. The driving devices may be adapted to adjust an x position, a y position, a z position, and/or an angular position of the stage 400 during processing. For example, with the ability to move in multiple directions, the stage 400 is operable to manipulate the workpieces thereon and move the workpieces to be in position as required for processing.

In some embodiments, a heating source HT (labeled in FIG. 6) is built in the stage 400. For example, during the reflow, the workpiece disposed over the stage 400 may be heated by the stage 400 to a predetermined temperature. Alternatively, the heating source HT may be in any other applicable locations other than directly built in the stage 400 as long as the heating source may provide energy to the workpiece during the reflow. The heating source HT may be or may include a thermal plate, a thermal couple, any suitable heating source that is configured to blow hot air or provide the radiated heat, etc. The details of stage movements and operations will be discussed later in accompanying with FIGS. 7A-7F.

In some embodiments, the stage 400 includes a base 410 and at least one protrusion 420 connected to the base 410, where the protrusion 420 is adapted to operably hold the workpieces to be processed. In some embodiments, a plurality of the protrusions 420 is distributed on the base 410 for carrying a batch of the workpieces to be processed. The workpieces to be processed (as mentioned in FIG. 4) may be placed over the protrusions 420 of the stage 400 with a one-to-one correspondence. Although six protrusions 420 are illustrated in FIG. 5, the stage 400 may have any number of rows and columns of the protrusions 420. The base 410 may include any suitable material which does not allow gas to flow through if no hole is formed in the base 410. The protrusions 420 may include suitable material(s) that allow gas (e.g., air, nitrogen, etc.) pass through the pores therein. For example, the base 410 is formed of a non-porous material (e.g., non-porous ceramic, metal, composite material, etc.). The protrusions 420 may include a porous material (e.g., porous ceramic), although they may also be formed of other materials.

With continued reference to FIGS. 5-6 and further referencing FIG. 2, the respective protrusion 420 may include a first portion 422 and a second portion 424 surrounded by the first portion 422. For example, the first portion 422 and the second portion 424 are respectively viewed as the outer ring and the inner portion of the protrusion 420. In some embodiments, a spacer 423 is interposed between the first portion 422 and the second portion 424 to spatially separate the second portion 424 from the first portion 422. In some embodiments, the spacer 423 laterally covers the inner part of the first portion 422, and the outer part of the first portion 422 may be encircled by a protection portion 421. It is noted that the first portion 422 and the second portion 424, as shown in FIGS. 5-6, are for illustrative purposes only, and the respective protrusion 420 may include any suitable number of portions to provide sufficient control for the workpiece to be processed. In some embodiments, the first portion 422 and the second portion 424 are formed of the porous material(s). The first portion 422 may be formed of a same material as that of the second portion 424, although they may be formed of different porous materials. The spacer 423 and/or the protection portion 421 may be formed of the non-porous material(s). The spacer 423 may include any suitable material and/or may be thick enough to isolate the first portion 422 from the second portion 424. By placing the spacer 423, the pressure applied to the first portion 422 and the pressure applied to the second portion 424 will not interfere with each other during the vacuuming.

In some embodiments, the top-view shape of the respective protrusion 420 is substantially the same as the top-view shape of the workpiece 10' (labeled in FIG. 4). For example, the workpiece to be processed is placed on a carrying surface 420t of the respective protrusion 420. In some embodiments, an area of the carrying surface 420t of the respective protrusion 420 is substantially less than an area of the first package component 100. The shape and the area of the second portion 424 of the respective protrusion 420 may substantially correspond to the shape and the area of the second package component 200 (refer to the top view shown in FIG. 4). For example, the second portion 424 of the respective protrusion 420 is a rectangular ring in the top view. The second portion 424 may have any top-view shape depending on the second package component 200. In some embodiments, the surface area A1 of the carrying surface of the first portion 422 is substantially greater than the surface area A2 of the carrying surface of the second portion 424. The area ratio (A1/A2) may be greater than or substantially equal to 1. For example, the area ratio (A1/A2) ranges from about 2 to about 4. It is noted that the surface areas (A1 and A2) the carrying surface of may vary according to the size of the workpiece to be disposed thereon. In other embodiments, the surface area A1 of the carrying surface 422t of the first portion 422 is substantially less than the surface area A2 of the carrying surface 424t of the second portion 424.

In some embodiments, multiple sets of vacuum modules (e.g., 500A and 500B) are installed. For example, each of the protrusions 420 is coupled to an independent set of vacuum modules (e.g., 500A and 500B). For example, one set of the vacuum module 500A is operably coupled to the first portion 422 and another set of the vacuum module 500B is operably coupled to the second portion 424. The vacuum modules (500A and 500B) may be independently controlled, and thus vacuum environment may be respectively generated in the first portion 422 and in the second portion 424. As described below in greater detail, different downward forces may be applied to the first package component 100 in different zones due to the air pressure caused by separate vacuum modules (500A and 500B). The vacuum may be generated in the first portion 422 and the second portion 424 at different ones of several time points by configuring independent sets of vacuum modules (e.g., 500A and 500B).

In some embodiments, each set of the vacuum module (500A or 500B) includes a vacuum generator 510 adapted to generate a vacuum, and the pipeline 505 connecting the vacuum generator 510 to the stage 400. In some embodiments, when the vacuum generator 510 is initiated, a suction or pressure differential is applied to the workpiece disposed on the respective protrusion 420 and may cause the workpiece to warp in an intended manner. For example, the vacuum generator 510 includes a vacuum pump, a valve, a hose, or any suitable element to create a pressurized environment. The vacuum module (500A or 500B) may include at least one sensor (e.g., 522 and 524) installed on the pipeline 505. The sensor(s) may be configured to measure desired data (e.g., process parameters) and/or detect potential failures associated with abnormal conditions.

In some embodiments, a flow rate sensor 522 is disposed between the stage 400 and the vacuum generator 510. For example, the flow rate sensor 522 serves as a leak detector and is configured to monitor the gas flow rate. The vacuum leak may be caused by uneven surface, contaminant on the carrying surface, force of extraction/manipulation applied, problems with the vacuum pipe, etc. In some embodiments, each set of the vacuum module (500A or 500B) includes at least one flow rate sensor 522. The first portion 422 and the second portion 424 may be coupled to separate flow rate sensors 522. For example, the flow rate sensors 522 respectively connected to the first portion 422 and the second portion 424 may run in parallel. In some embodiments, the flow rate sensors 522 connected to one of the protrusions 420 are linked in parallel with another flow rate sensors 522 connected to another one of the protrusions 420.

By utilizing the flow rate sensors 522 linked in parallel, when an abnormal state occurs to any one of the protrusions 420, the user may easily locate which one of the protrusions 420 with problems (e.g., leakage). The flow rate sensor 522 connecting the first portion 422 of one of the protrusions 420 may be optionally linked to another flow rate sensor 522 connecting the first portion 422 of another one of the protrusions 420. Similarly, the flow rate sensor 522 connecting the second portion 424 of one of the protrusions 420 may be optionally linked to another flow rate sensor 522 connecting the second portion 424 of another one of the protrusions 420. The pipeline linked to the flow rate sensors 522 connecting the first portions 424 and the pipeline linked to the flow rate sensors 522 connecting the second portions 424 are illustrated in dashed lines to show the pipeline may be or may not be present.

In some embodiments, a vacuum sensor 524 is installed on the pipeline 505. The vacuum sensor 524 may be or may include a pressure sensor, a pressure switch, a pressure transmitter, or any suitable electronic component that provides a signal representing the vacuum level (or an amount of vacuum pressure). For example, each of the vacuum modules (500A and 500B) includes at least one vacuum sensor 524 disposed between the vacuum generator 510 and the protrusion 420. In some embodiments, the vacuum sensor 524 is installed on the pipeline 505 between the vacuum generator 510 and the flow rate sensor 522. The vacuum module 500A linked to the first portion 422 and the vacuum module 500B linked to the second portion 424 may include separate vacuum sensors 524. By such configuration, when an abnormal state occurs to any one of the first portion 422 and the second portion 424, the user may easily locate which the portion with problems.

In some embodiments, a vacuum regulator 530 is installed on the pipeline 505. The vacuum regulator 530 may be disposed between the vacuum generator 510 and the protrusion 420 and configured to operably control the degree of vacuum. The vacuum regulator 530 may be or may include an electronic vacuum regulator, a mechanical vacuum regulator 132, or any suitable type of regulator that is able to regulate a vacuum generated by the vacuum regulator 530. In some embodiments, the vacuum regulator 530 is installed on the pipeline 505 between the vacuum generator 510 and the vacuum sensor 524 to adjust the vacuum pressure. The vacuum module 500A connecting to the first portion 422 and the vacuum module 500B connecting to the second portion 424 may include separate vacuum regulators 530. By such configuration, the vacuum pressure in the first portion 422 and the vacuum pressure in the second portion 424 may be independently regulated. The vacuum pressure may be precisely controlled by using the vacuum regulator 530, thereby eliminating undesirable die-shifting issues. The operation details of the vacuum regulator 530 will be described further below in accompanying the FIGS. 7-10. It is noted that the vacuum modules are illustrated in a simplified manner, and additional elements (e.g., pumps, valves, controllers, inlet and outlet, etc.) are not shown for ease of descriptions.

Figure 7A:
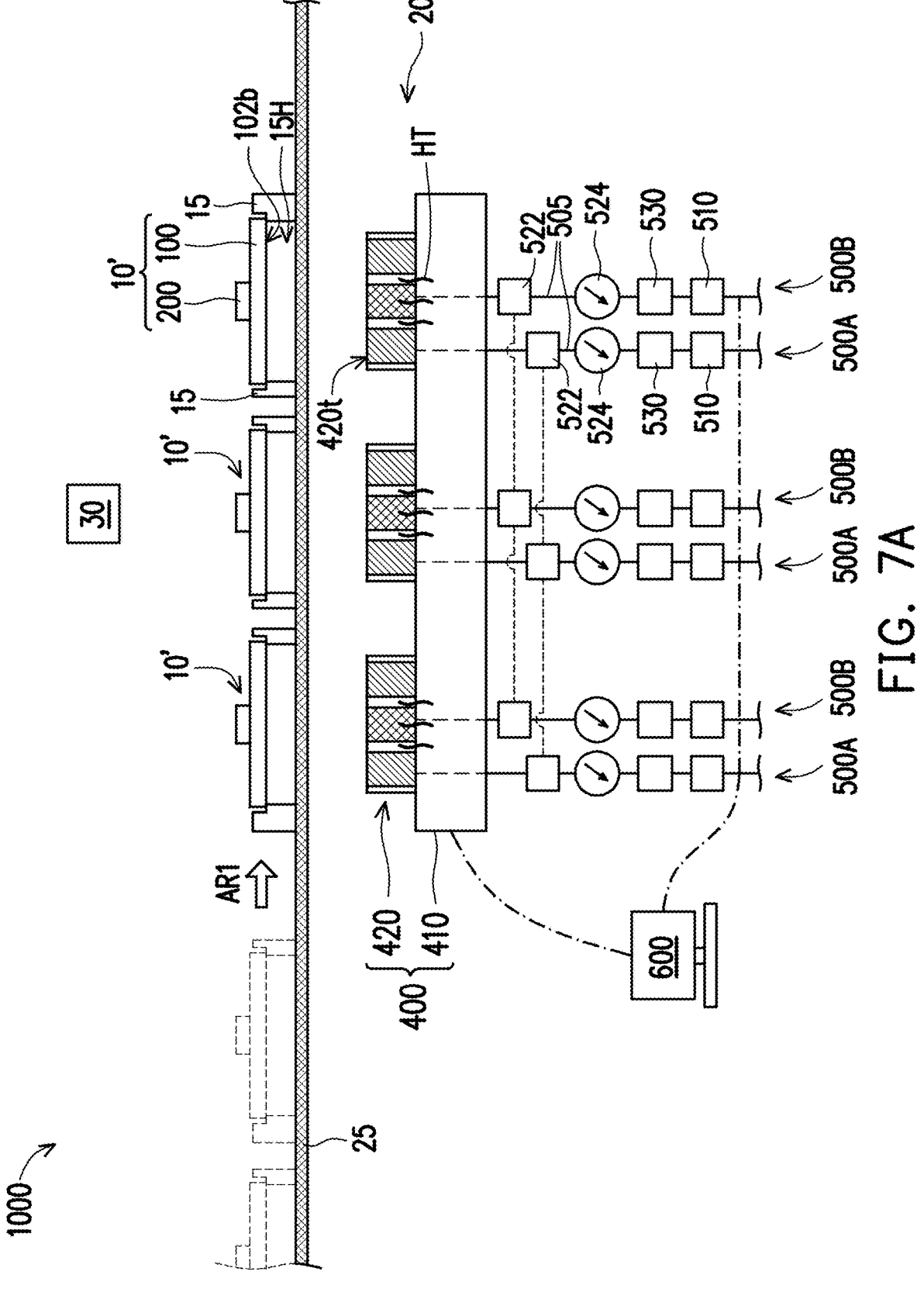
FIGS. 7A-7F are schematic cross-sectional views of a method of processing package components at various stages according to some embodiments.
Figure 7B:
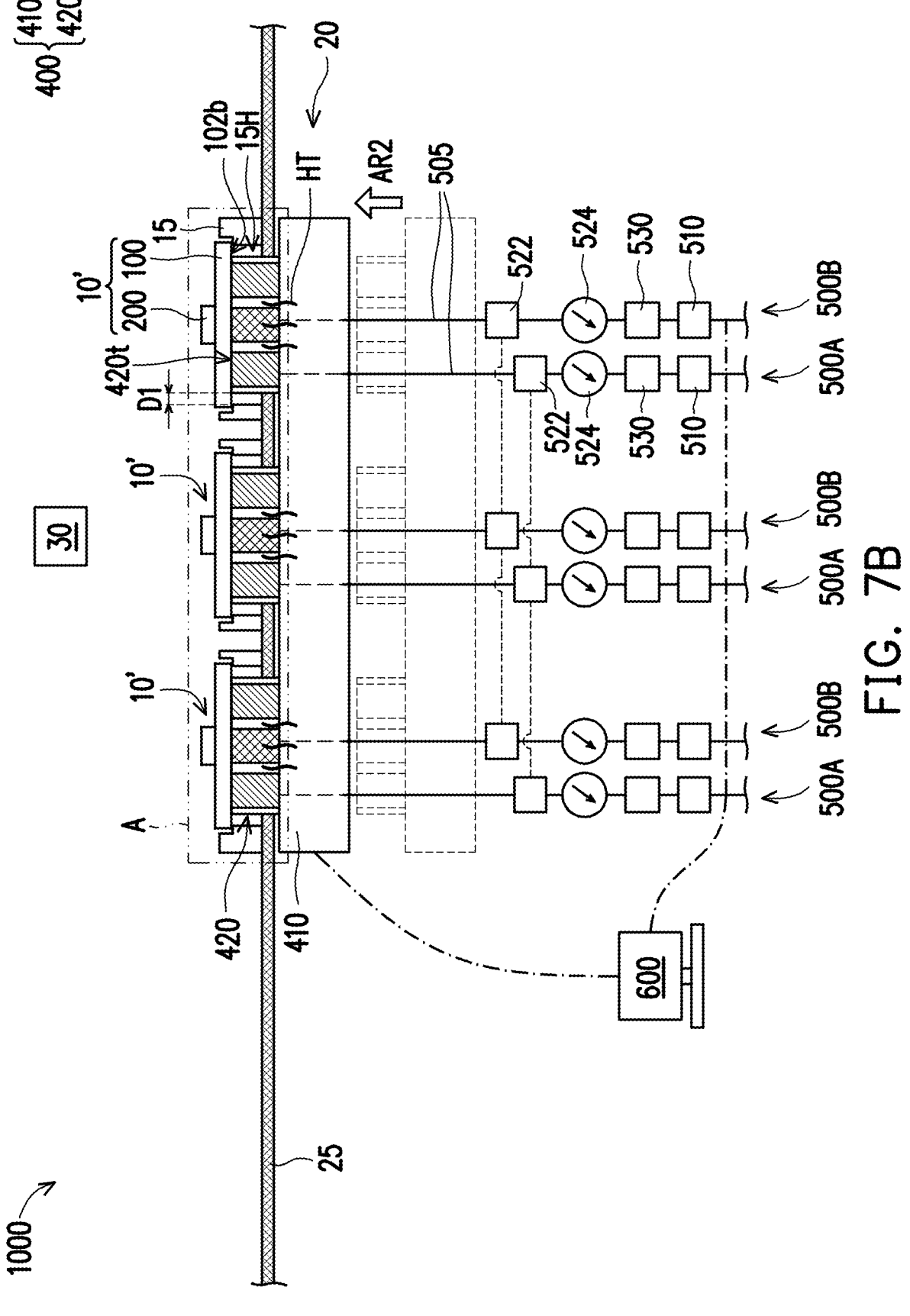
Figure 7C:
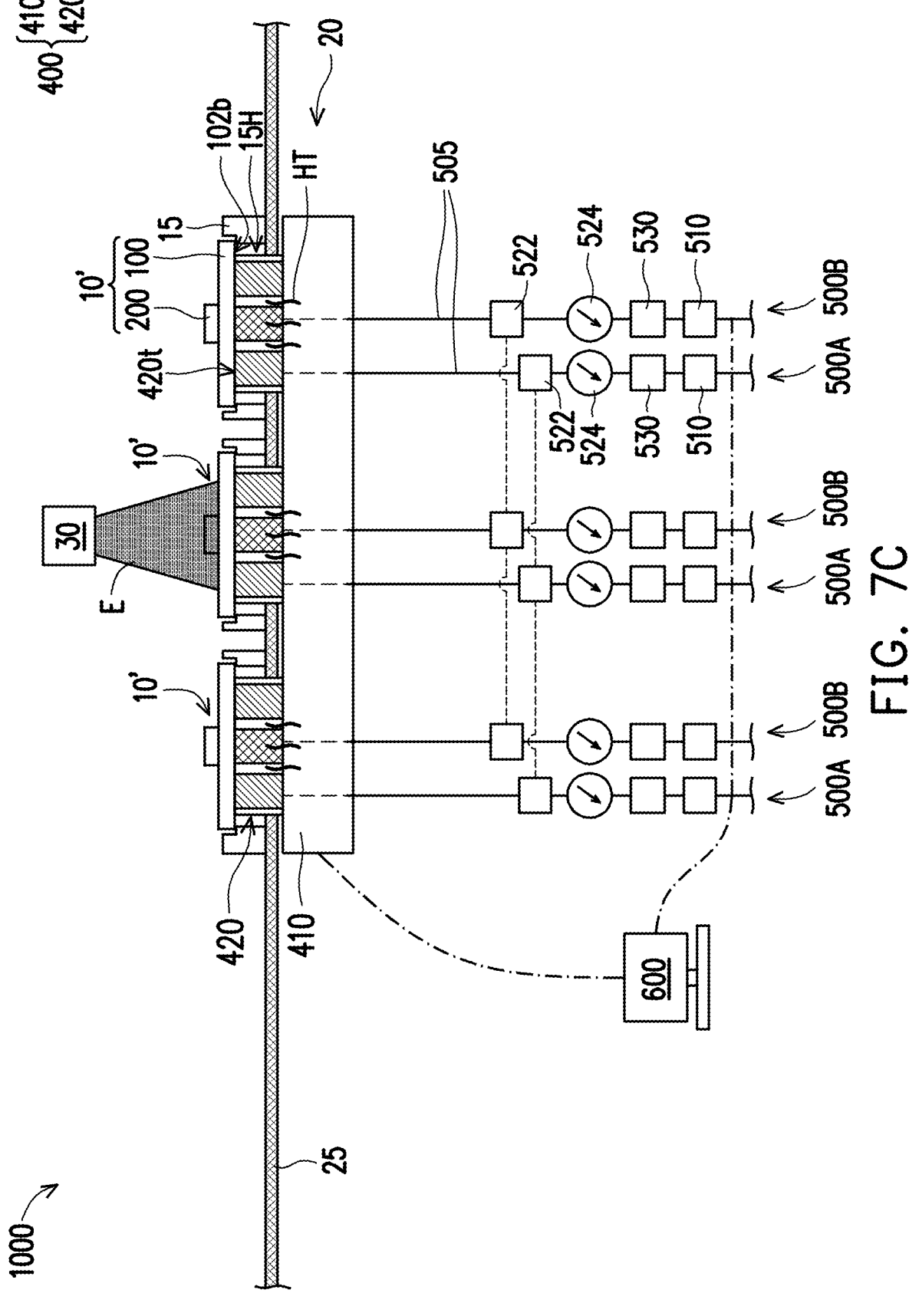
Figure 7D:
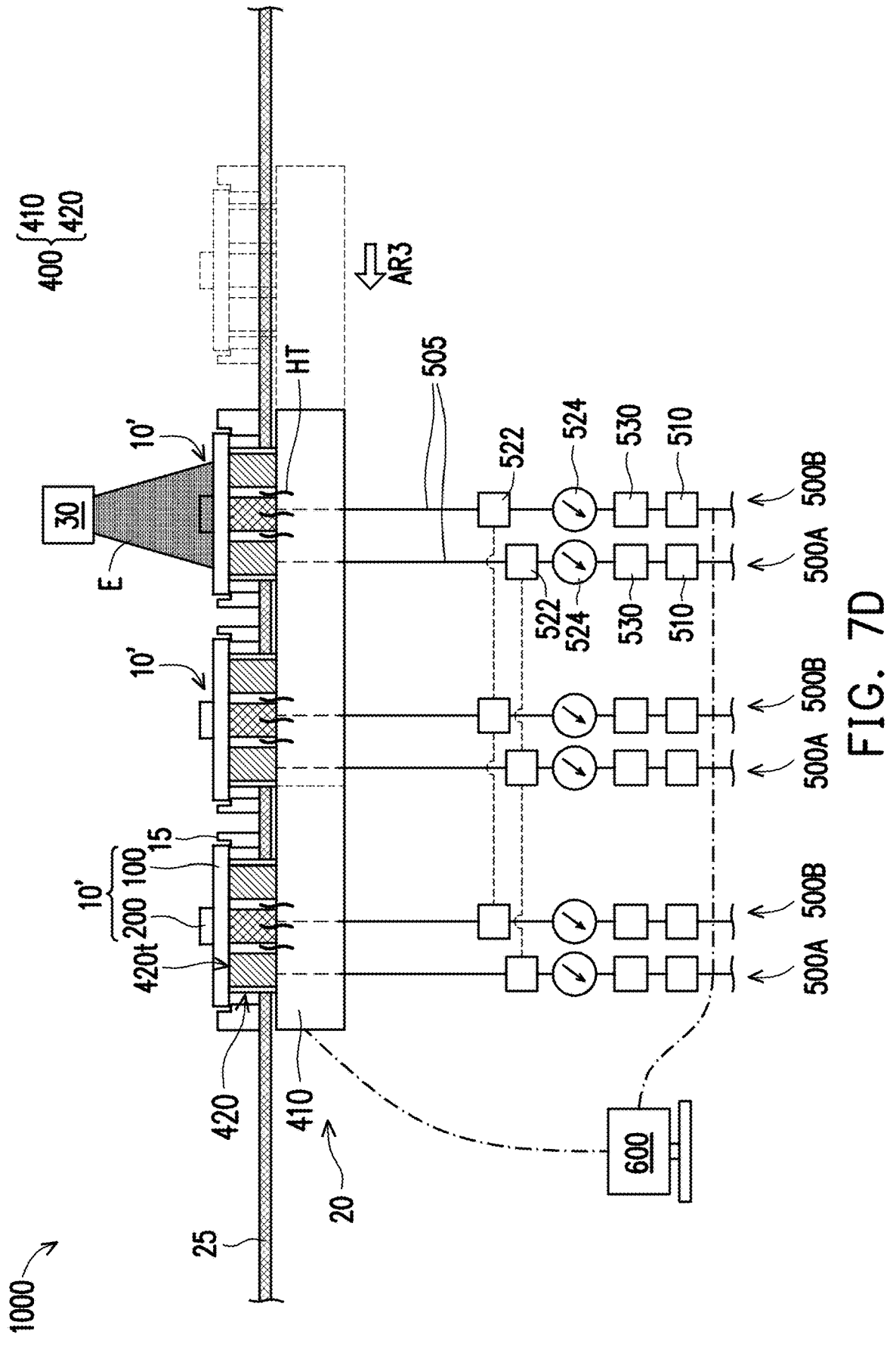
Figure 7E:
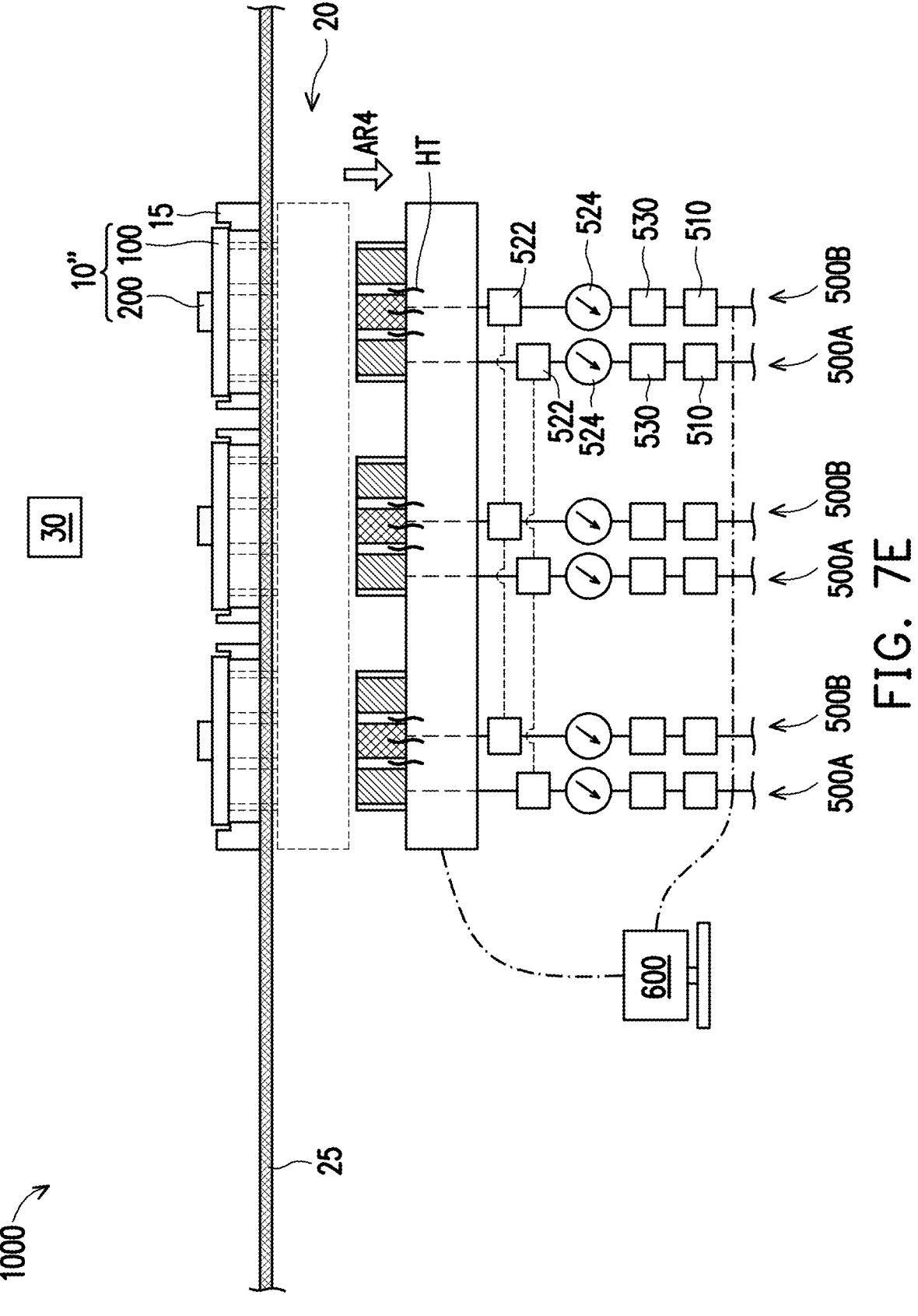
Figure 7F:
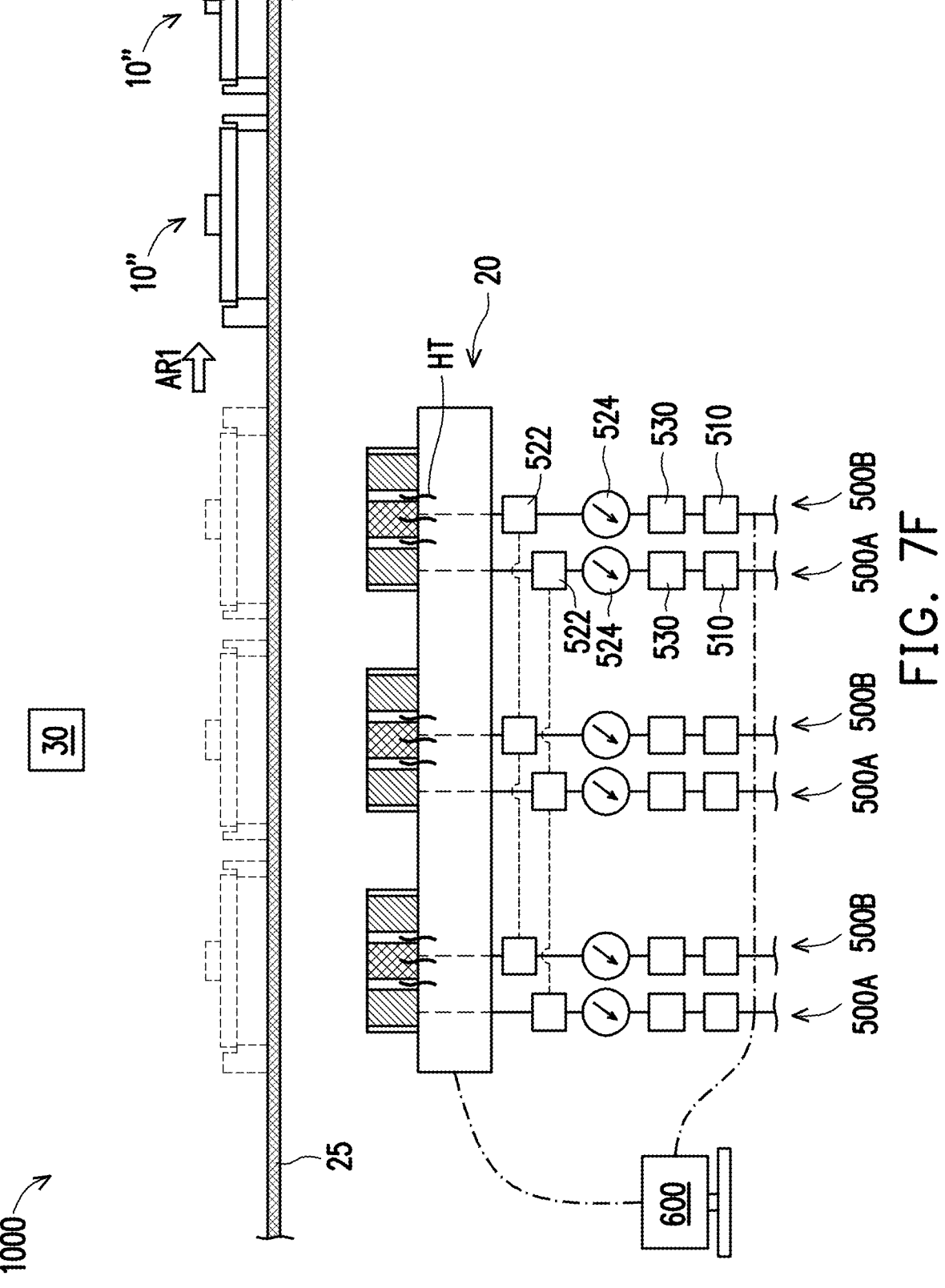
Figure 8:
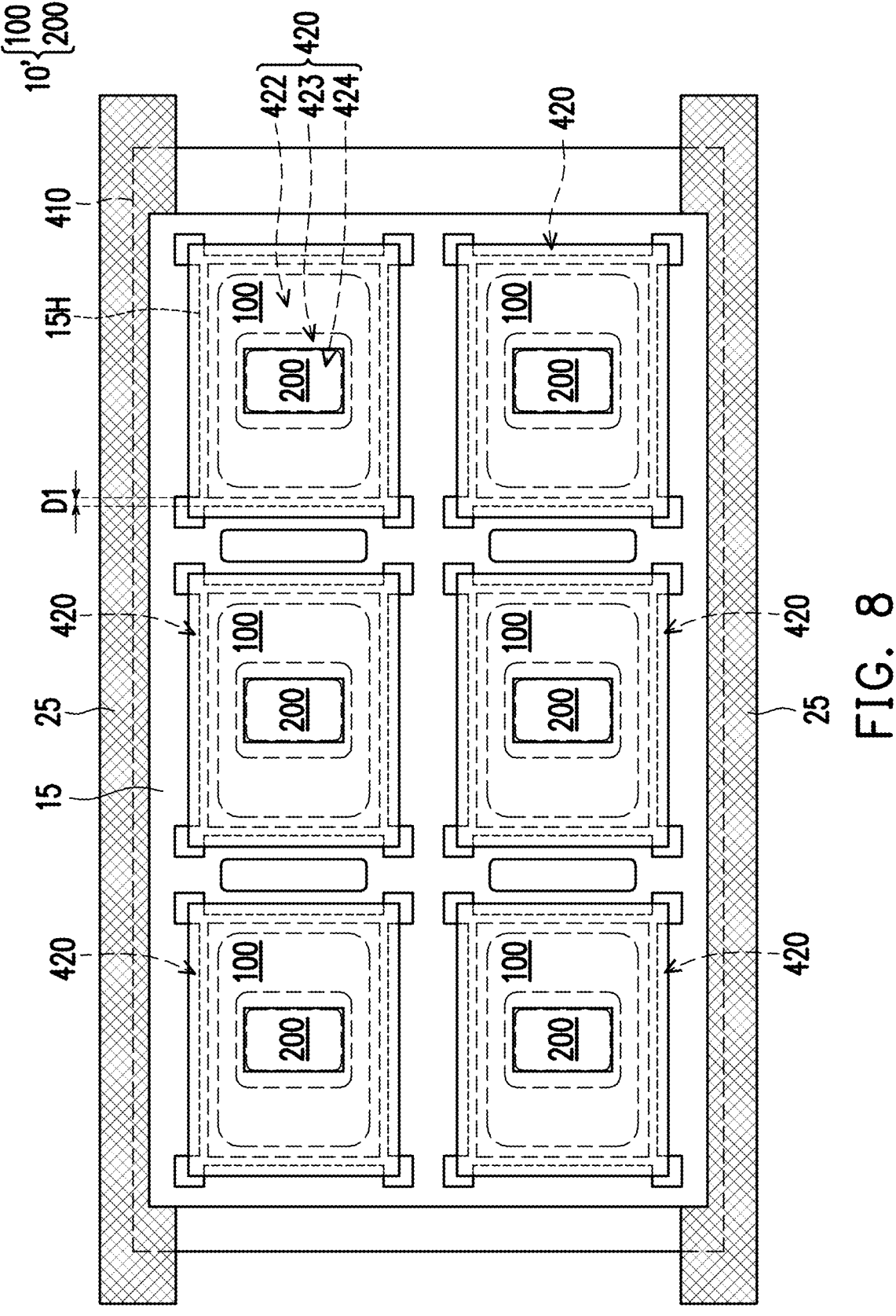
FIG. 8 is a schematic top view illustrating the dashed box A outlined in FIG. 7B according to some embodiments.
Figure 9:
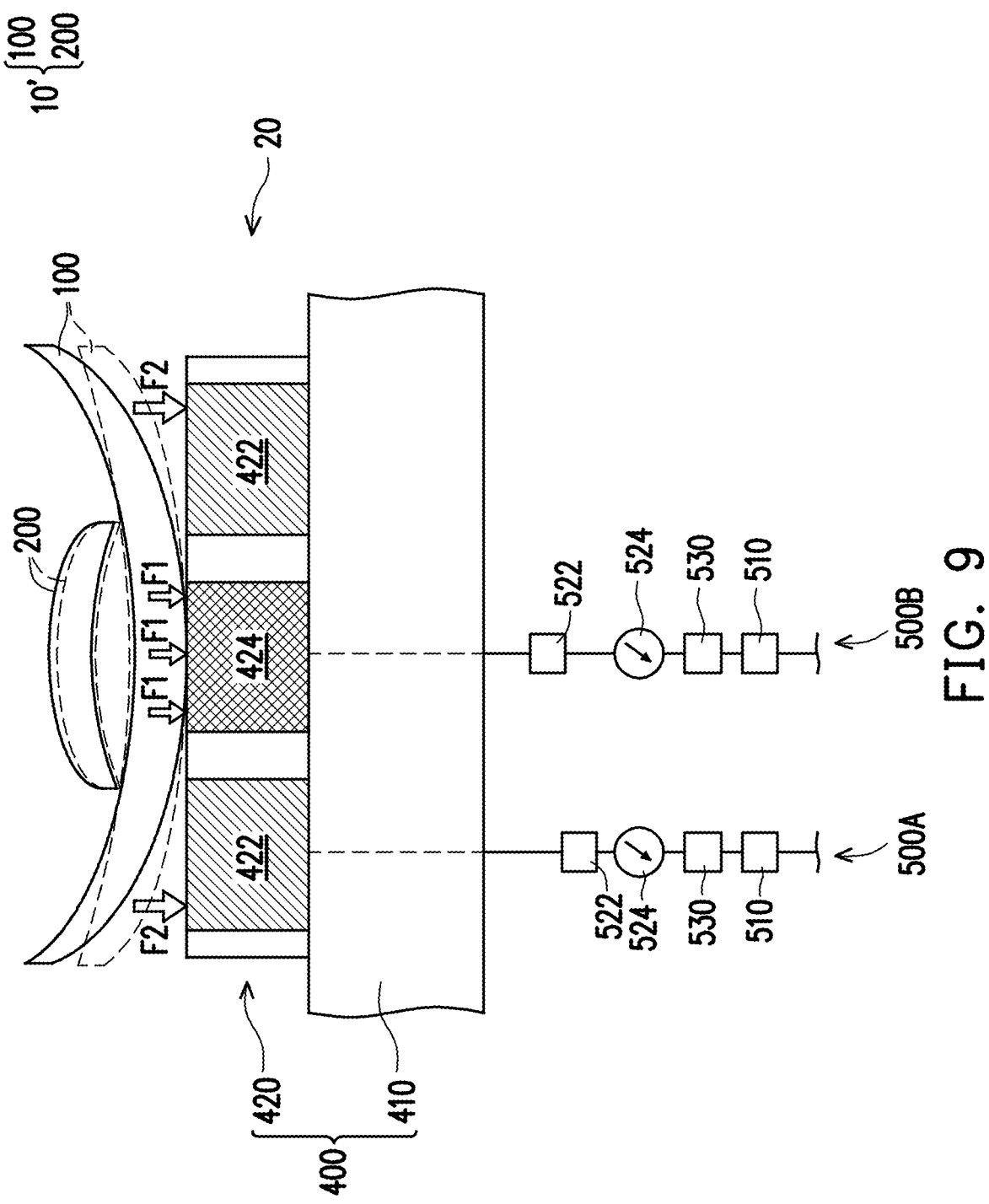
FIG. 9 is a schematic cross-sectional view illustrating a warpage behavior of package components being changed by a vacuum stage according to some embodiments.
Figure 10:
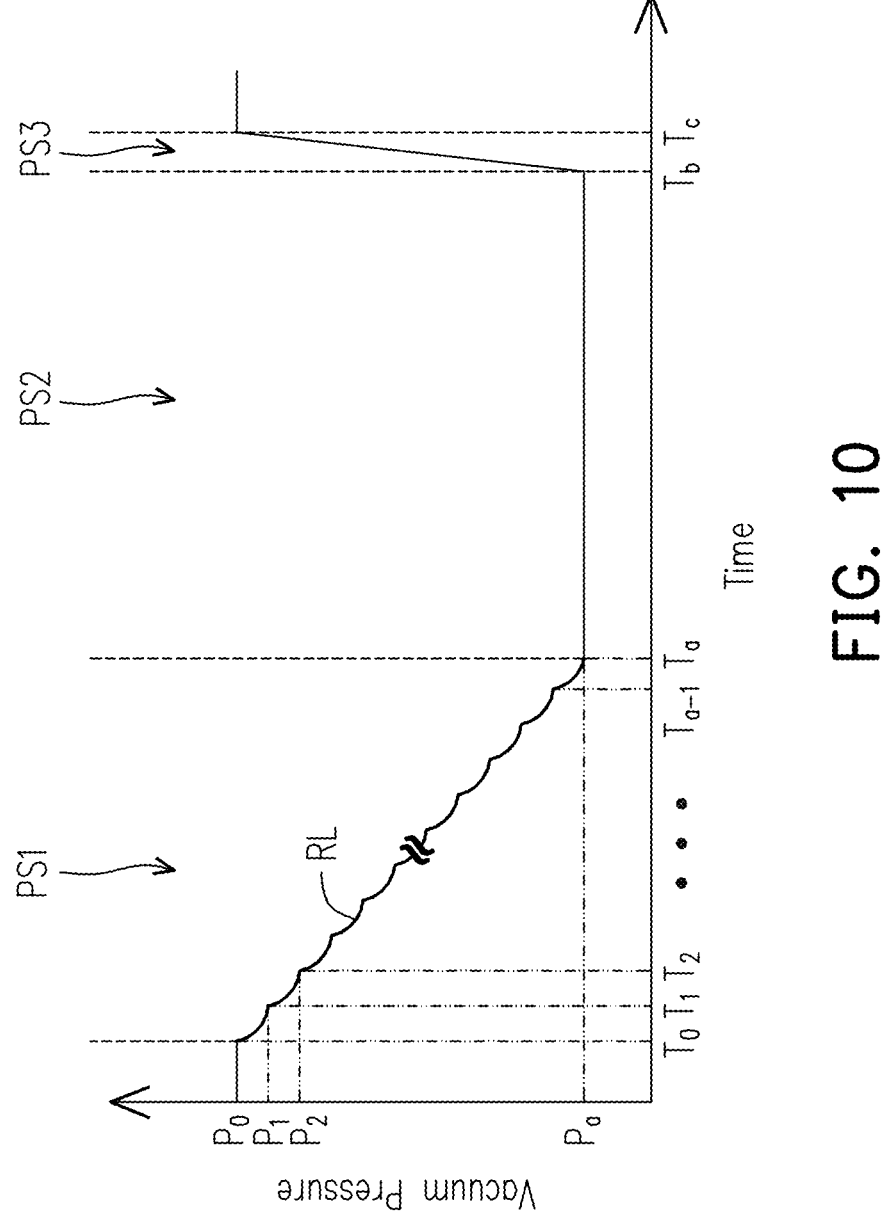
FIG. 10 is a schematic diagram of pressure versus time for processing package components at various stages according to some embodiments.

FIGS. 7A-7F are schematic cross-sectional views of a method of processing package components at various stages according to some embodiments, FIG. 8 is a schematic top view illustrating the dashed box A outlined in FIG. 7B according to some embodiments, FIG. 9 is a schematic cross-sectional view illustrating a warpage behavior of package components being changed by a vacuum stage according to some embodiments, and FIG. 10 is a schematic diagram of pressure versus time for processing package components at various stages according to some embodiments. Throughout the various views and illustrative embodiments, like reference numbers are used to designate like elements. While the operation method is illustrated in FIGS. 7A-7F as a series of acts or events, it will be appreciated that the illustrated ordering of such acts or events are not to be interpreted in a limiting sense. It is also noted that the workpieces 10' shown in FIGS. 7-9 are shown in a simplified manner for ease of illustration, and the details of the first/second package components of the respective workpiece 10' may refer to the descriptions related to FIG. 1B.

Referring to FIG. 7A and also referencing FIGS. 4-6, a semiconductor fabrication system 1000 includes the process tool 20, a conveyor mechanism 25 extending across the stage 400 of the process tool 20, and at least one energy source 30 disposed over the stage 400 of the process tool 20. The semiconductor fabrication system 1000 configured to perform a reflow process may be viewed as a reflow system in accordance with some embodiments. The conveyor mechanism 25 may be adapted to transfer the workpieces 10' to be processed. The energy source 30 may be adapted to provide energy to the workpieces 10'. For example, a plurality of the workpieces 10' carried by the carrier 15 is disposed on the conveyor mechanism 25 and transferred toward the stage 400 by the conveyor mechanism 25 for processing. It is noted that although only one carrier 15 is illustrated, a plurality of the carriers 15 carrying several batches of the workpieces 10' may be transferred to the process tool 20 one by one using the conveyor mechanism 25 in accordance with some embodiments.

For example, the workpieces 10', which includes the first package component 100 and the second package component 200 that have not bonded to each other yet, are placed on the carrier 15. The workpieces 10' and the carrier 15 shown herein may be the schematic cross-sectional view of the structure as taken along line 7-7 of FIG. 4. In some embodiments, a frictional force generated between the carrier 15 and the conveyor mechanism 25 prevents relative motion therebetween, so that the conveyor mechanism 25 and the carrier 15 may steadily transfer the workpieces 10'. Alternatively, the carrier 15 may be physically fixed onto the conveyor mechanism 25 through any suitable fasteners. In some embodiments, at least the hollow regions 15H of the carrier 15 are not covered by the conveyor mechanism 25. For example, portions of the workpieces 10' are accessibly revealed by the hollow regions 15H of the carrier 15 and the conveyor mechanism 25, so that the protrusions 420 of the stage 400 may pass through the carrier 15 and the conveyor mechanism 25 to be in contact with the workpieces 10' in the following step.

The conveyor mechanism 25 and the carrier 15 carrying the workpieces 10' may move forward as indicated by the arrow AR1, and then the carrier 15 may be positioned to the stage 400. In some embodiments, the carrier 15 is positioned right above the stage 400. For example, each of the workpieces 10' accessibly revealing by the hollow regions 15H of the carrier 15 is substantially aligned with one of the protrusions 420 of the stage 400. In some embodiments, the opening area of the respective hollow region 15H is greater than the surface area of the carrying surface 420t of the respective protrusion 420, so that the protrusion 420 may pass through the hollow region 15H without interfering in the subsequent step. In some embodiments, when (or before) the workpieces 10' are transferred in position, the stage 400 undergoes a preheat via the heating source HT at a temperature in a range from about 25° C. to about 250° C. Alternatively, the heating of the stage 400 may be started after the carrier 15 is in position.

With continued reference to FIG. 7A and further referencing FIG. 7B and FIG. 8, when the carrier 15 with the workpieces 10' is positioned, the stage 400 is activated and moves upwardly as indicated by the arrow AR2 so as to be in contact with the workpieces 10'. For example, the stage 400 is controlled by the operating device 600 to rise from its original position (as outlined in dashed lines) to a position (as outlined in solid lines) abutted against the workpieces 10'. In some embodiments, during the upward movement of the stage 400, the stage 400 remains heated as indicated by the heating source HT. Alternatively, the heating action of the stage 400 may be started before, during, or after the upward movement of the stage 400. In some embodiments, the protrusions 420 of the stage 400 are directly coupled to the first package components 100 of the workpieces 10' with a one-to-one correspondence. For example, each of the protrusions 420 passes through the conveyor mechanism 25 and the hollow regions 15H of the carrier 15 to be in physical contact with one of the bottom surfaces 102b of the workpieces 10'. The size of the respective hollow region 15H may be large enough so that the protrusions 420 will not get stuck by the carrier 15 when moving. For example, a lateral clearance D1 is between the respective protrusion 420 and the adjacent sidewall of the carrier 15 after the carrying surfaces 420t of the protrusions 420 are abutted against the bottom surfaces 102b of the workpieces 10'.

As shown in the top view of FIG. 8, the respective first package component 100 may overlap the corresponding protrusion 420 of the stage 400. In some embodiments, the area of the first package component 100 is greater than the area of the corresponding protrusion 420. For example, the surface area of the carrying surface 420t of the respective protrusion 420 is less than the bottom surface 102b of the first package component 100 of the corresponding workpiece 10', so that when the protrusion 420 is coupled to the workpiece 10', the protrusion 420 may be partially in contact with the first package component 100 of the corresponding workpiece 10'. In some embodiments, the contact area of the respective workpiece 10' and the corresponding protrusion 420 is the surface area of the carrying surface 420t of the protrusion 420. In some embodiments, the contact area of the respective workpiece 10' and the corresponding protrusion 420 is less than the surface area of the carrying surface 420t of the protrusion 420 due to the warpage of the first package component 100.

In some embodiments, in the top view, the second portion 424 (e.g., the inner portion) of the respective protrusion 420 is substantially aligned with the predetermined location where corresponds to the second package component 200 of the workpiece 10'. For example, the second portion 424 of the respective protrusion 420 is positioned at the applicable location directly under the second package component 200. The top-view shape of the second portion 424 of the protrusion 420 may be similar to the top-view shape of the second package component 200 of the corresponding workpiece 10'. The second portion 424 may vertically overlap both of the second package component 200 and the first package component 100. For example, in the top view as shown in FIG. 8, the second portion 424 of the protrusion 420 and the second package component 200 of the workpiece 10' substantially overlap.

With continued reference to FIG. 7B and further referencing FIG. 9, each of the first package components 100 and the second package components 200 may have different coefficient of thermal expansion (CTE) and may intrinsically warped as illustrated in the solid lines in FIG. 9. The first package component 100 and the second package component 200 disposed thereon may contract at rates depending on their respective CTE during processing (e.g., reflow). If the warpage behavior of the first package component 100 and/or the second package component 200 is not well-controlled, their warpage will cause irregular joints and/or cracks, and hence the yield of the bonding process is adversely affected. Moreover, if the vacuuming is not well-controlled during processing, the displacement of the second package component 200 on the first package component 100 (also referred to the die-shifting) will occur, so that the bonding accuracy is adversely affected. The methods and operations of controlling warpage behavior and reducing die-shifting are discussed below in greater detail.

In some embodiments, controlling the warpage behavior and the die-shifting of the workpieces 10' is facilitated by controlling the vacuum pressure applied to the protrusions 420 of the stage 400. For example, during the operation, the vacuum generators 510 evacuate gases from the first/second portion of the protrusion 420, thereby lowering the pressure within the protrusion 420. When the workpiece 10' is placed against the carrying surface 420t of the protrusion 420 and the pressure within the protrusion 420 has been reduced by the vacuum generator 510, the pressure difference between the side of the workpiece 10' facing the protrusion 420 and the side of the workpiece 10' facing away from the protrusion 420 may hold the protrusion 420 against the protrusion 420. The pressure difference may warp the workpiece 10' into an intended shape as controlling the applied pressure. In some embodiments, the vacuum modules (500A and 500B) coupled to the respective protrusion 420 are configured to be initiated in a sequential manner. In some embodiments, a two-step vacuuming process is performed on the respective workpiece 10' to be processed. For example, once the workpieces 10' are transferred in place, the first step of vacuuming is performed on the second portions 424 (e.g., the inner portions) of the protrusions 420, and then the second step of vacuuming is performed on the first portions 422 (e.g., the outer rings) of the protrusions 420 after a predetermined time delay. The vacuum generators 510 of the vacuum modules 500B that are coupled to the second portions 424 may be initiated prior to initiating the vacuum generators 510 of the vacuum modules 500A that are coupled to the first portions 422.

As shown in FIG. 9, when the first step of vacuuming is performed, the downward force F1 may be exerted to the area of the workpiece 10' corresponding to the second portion 424 of the protrusion 420 by the vacuum module 500B. Subsequently, the downward force F2 may be exerted to the area of the workpiece 10' corresponding to the first portion 422 of the protrusion 420 by the vacuum module 500A when the second step of vacuuming is started. During the vacuuming, the downward forces (F1 and F2) exerted to the respective workpiece 10' due to the pressure caused by the vacuum may result in the changes of the warpage profiles of the first package component 100 and the second package component 200 (as outlined in the dashed lines). For example, the adjustment of the warpage profile is facilitated by applying predetermined downward forces (F1 and F2). In some embodiments, the downward force F1 applied to the portion (e.g., central portion) of the workpiece 10 is different from the downward force F2 applied to the portion (e.g., peripheral portion) of the workpiece 10'. The different downward forces (F1 and F2) may be exerted to the workpiece 10' in the sequential manner (or at the same time in some embodiments). In some embodiments, the downward forces (F1 and F2) are of the same magnitude but exerted onto the workpiece 10' in the sequential manner. If the same downward forces (F1 and F2) are exerted to the workpiece 10' at the same time without any time delay, the warpage profile of the workpiece 10' will change rapidly, so that the second package component 200 on the first package component 100 shifts due to a sudden impact. By using the two-step vacuuming process, the warpage profile of the workpiece 10' may be altered in a smooth way without causing significant die-shifting. It is noted that although the first package component 100 having a concave warpage profile (or referred to as a smiling warpage profile) is illustrated in FIG. 9, the first package component 100 may have different warpage profile (e.g., convex warpage profile or a combination of the concave and convex warpage profile).

With continued reference to FIGS. 7B and 9 and further referencing FIG. 10, a profile of the vacuum pressure versus time is shown in FIG. 10 for the vacuum modules (500A and/or 500B). It is seen that within a period of time (e.g., from $T_0$ to $T_a$), the vacuum pressure lowers from the initial pressure $P_0$ (e.g., atmospheric pressure) to the preset pressure $P_a$ (e.g., process pressure). As shown in the first phase PS1, during the period of time starting from the time point $T_0$ the vacuuming is started and ending at the time point $T_a$ the preset pressure $P_a$ is attained. Next, the reflow process is performed at the second phase PS2 during the period of time starting from the time point $T_a$ and ending at the time point $T_b$. After the reflow process is finished, the vacuuming ends at the third phase PS3. During the period of time starting from the time point $T_b$ to the time point $T_e$, the vacuum pressure is increased back to the initial pressure $P_0$. The first phase PS1 is described below in greater detail, and the second phase PS2 and the third phase PS3 will be described later in accompanying with FIGS. 7C-7F.

In some embodiments, the change of vacuum pressure at the first phase PS1 may be fine-controlled by segmenting the time period. For example, at the first phase PS1, the period of time (e.g., from $T_0$ to $T_a$) is segmented into a plurality of time segments (e.g., from $T_0$ to $T_1$, from $T_1$ to $T_2$, . . . , and from $T_{a-1}$ to $T_a$). It is noted that the first phase PS1 may be divided into any number of time segments depending on process requirements. For example, letting the change in pressure during the time segment be $\Delta P$ and the change in time be $\Delta T$, the slope ($\Delta P/\Delta T$) varies during the time segment. In some embodiments, the slope ($\Delta P/\Delta T$) continuously changes within the respective time segment as shown in FIG. 10. The slope ($\Delta P/\Delta T$) within each time segment may be less than zero (i.e. negative slopes) and may increase along time.

As can be seen on the pressure-time curve RL in FIG. 10, within the respective time segment (e.g., from $T_0$ to $T_1$, from $T_1$ to $T_2$, . . . , or from $T_{a-1}$ to $T_a$), a gradual and smooth vacuum curve profile is provided. The greater number of the time segments implemented within the first phase PS1, the more gradual a step down in pressure may be achieved. The pressure slope change curve of each time segment may be the same or may be similar to one another. Although the pressure slope change curves of the time segments may be different, if desired. In some embodiments, the change in slope of the pressure-time curve RL in the respective time segment is achieved by incorporating the vacuum regulator 530 situated in the pipeline 505. For example, if the vacuum generator is initiated without regulating the vacuum pressure and/or segmenting the time period into multiple time segments, the vacuum pressure suddenly dropping from the initial pressure $P_0$ to the preset pressure $P_a$ will cause the displacement of the second package component 200 due to a sudden force exerted onto the workpiece 10'.

Referring back to FIG. 7B and also referencing FIG. 10, the vacuum regulator 530 may be configured to regulate a vacuum pressure produced from the vacuum generator 510, thereby reducing the chance of die-shifting caused by a sudden impact from the vacuum pressure. The vacuum sensor 524 may provide a signal representing the vacuum level (or an amount of vacuum pressure) during the vacuuming. In some embodiments, in operation the vacuum regulator 530 and the vacuum sensor 524 mounted in the pipeline 505 facilitates smooth attainment of the preset pressure $P_a$ applied to the respective protrusion 420 of the stage 400. The vacuum pressure applied to the first portion 422 and the second portion 424 of the respective protrusion 420 may be separately regulated by the vacuum regulators 530 in the vacuum modules (500A and 500B). In some embodiments, the vacuum level applied to each of the first portions 422 is controlled by the vacuum regulator 530 of the respective vacuum module 500A in a manner to match the pressure-time curve RL. Similarly, the degree of vacuum applied to each of the second portions 424 may be controlled by the vacuum regulator 530 of the respective vacuum module 500B in a manner to match the pressure-time curve RL.

Still referring to FIG. 7B, during the vacuuming, the amount of pressure inside the pipeline 505 may be monitored by the respective flow rate sensor 522, so that an abnormal condition (e.g., leakage, jams, etc.) with the vacuum modules can be detected. As described in preceding paragraphs, the first portion 422 and the second portion 424 of the respective protrusion 420 may be coupled to separate flow rate sensors 522. The use of independent flow rate sensors 522 may be able to locate the portion of the protrusion at which an abnormal condition is detected, thereby reducing the troubleshooting time in identifying the portion with problems. In some embodiments, during the upward movement and the vacuuming, the stage 400 remains heated. Alternatively, the heating action of the stage 400 may be started during or after the upward movement/vacuuming of the stage 400.

Referring to FIGS. 7C-7D, the reflow process may be performed on each of the workpieces 10'. In some embodiments, the energy source 30 is disposed above the stage 400, and the workpieces 10' are exposed to energy E to reflow the conductive terminals (e.g., the conductive terminals 240 labeled in FIG. 1B) disposed between the first package component 100 and the second package component 200. The energy source 30 may be or may include a radiation source (e.g., a laser head, an infrared (IR) lamp, etc.) that provides radiation to the workpiece 10' to be reflowed. Alternatively, the energy source 30 may include a heat source or any acceptable thermal energy source. It is noted that although only one energy source 30 is illustrated, a plurality of energy sources 30 may be provided to process multiple workpieces at the same time in other embodiments.

With continued reference to FIG. 7C and further referencing FIG. 1B, during the reflow process, the energy source 30 is activated to emit the energy E toward one of the workpieces 10', and the emission of the energy E may increase the temperature of the one of the workpieces 10'. In some embodiments where the energy source 30 includes the laser head, the reflow is performed by radiating laser beam(s) to the workpiece 10'. In some embodiments, the energy exposure process is performed on the one of the workpieces 10' for a predetermined time period. During the energy source 30 is activated, the stage 400 may be continuously heated via the heating source HT in the stage 400. For example, during the reflow, one side of the workpiece 10' facing the stage 400 is heated by the corresponding protrusion 420, and the opposing side of the workpiece 10' facing away the stage 400 is heated by the energy source 30.

In some embodiments, during the reflow, the heat from two different sources (e.g., the energy source 30 and the heating source HT in the stage 400) may be applied on two opposing sides of the workpiece 10' with an adequate time period to enable the workpiece 10' to have two or more temperatures or temperature differences. In some embodiments, the heating is performed for a duration ranging from about 3 minutes to about 10 minutes for a temperature ranging from about 25° C. to about 400° C. The amount of time for the heating may vary depending on process requirements and the characteristics of the workpiece to be processed. Alternatively, the amounts of heat applied to the first package component and the second component of the workpiece via the energy source 30 and the heating source HT in the stage 400 may be substantially the same. It is noted that the applied amounts of heat provided by the energy source 30 and the heating source HT in the stage 400 may be separately adjusted depending on the characteristics of the workpiece 10' and process requirements.

In some embodiments, the one of the workpieces 10' is heated with heating temperature(s) above a threshold temperature. For example, the first package component 100 and the second package component 200 of the workpiece 10' are heated with different heating temperatures. Under this scenario, the warpage effect and level of the second package component 200 may be different from those of the first package component 100 underlying the second package component 200. The warpage behavior between the first package component 100 and the second package component 200 may be tuned by regulating the heating temperatures. In this manner, the warpage behavior of the first package component 100 may substantially match the warpage behavior of the second package component 200. Alternatively, the first package component 100 and the second package component 200 of the workpiece' may be heated with the same heating temperature.

For example, the one of the workpieces 10' is heated to a temperature higher than the melting temperature of the conductive terminals 240 (labeled in FIG. 1B), and hence the conductive terminals 240 are molten. The molten conductive terminals 240 may wet the contact pads 104 of the first package component 100. In some embodiments where the conductive terminals 240 include solder, the solder may transition to a liquid state when reaching the melting temperature, and the solder may adhere to both the first package component 100 and the second package component 200, so that solder joints are formed when the solder cools. For example, the melting temperature of the conductive terminals 240 ranges from about 170° C. to about 230° C. However, the melting temperature of the conductive terminals 240 may vary depending on their material contents. The disclosure is not limited thereto.

Continue to FIGS. 7C-7D, the workpieces 10' placed over the stage 400 may be heated one by one in accordance with some embodiments. The stage 400 may be controlled by the operating device 600 to be moveable in the x-y direction so as to properly align with the energy source 30 for processing the workpieces 10'. For example, after heating the one of the workpieces 10' is complete, the stage 400 moves as indicated by the arrow AR3 in FIG. 7D, while the energy source 30 remains in a fixed position. It should be understood that the moving direction shown in FIG. 7D is for illustrative purposes only, and the movement of the stage may vary and construe no limitation in the disclosure. Alternatively, the energy source 30 is configured to operably move to be aligned with the workpiece, and the stage 400 may remain stationary.

With continued reference to FIGS. 7C-7D and further referencing FIG. 10, the reflow process may be performed at the second phase PS2. For example, the vacuum has attained a stable preset vacuum $P_a$ at the second phase PS2. In some embodiments, the vacuum pressure applied to the respective protrusion 420 is controlled to remain constant during the processing period between time points $T_a$ and $T_b$. For example, as shown in FIG. 10, the pressure-time curve RL flattens out at the second phase PS2. During the reflow, the vacuum is maintained, and detection and monitor of abnormal condition(s) are continued via the operation of the vacuum sensor 524 and the flow rate sensor 522 until the reflow process ends.

Referring to FIG. 7E and also referencing FIG. 1C, once the reflow process performed on the batch of the workpieces 10' carried by the carrier 15 is complete, the vacuum in the protrusions 420 of the stage 400 is released. In some embodiments, the emission of the energy from the energy source 30 stops as the reflow is complete. After the reflow is complete, the workpiece 10' may be cooled. For example, the solder regions are cooled and solidified. The second package component 200 may be affixed to the first package component by the conductive joints CJ (shown in FIG. 1C) that provide electrical and mechanical connections. At this stage, the protrusions 420 of the stage 400 may be separated from the workpieces 10" that have been reflowed. In some embodiments, the stage 400 is activated and move away from the carrier 15. For example, the stage 400 is controlled to move downwardly away from the carrier 15 and the conveyor mechanism 25 as indicated by the arrow AR4. In some embodiments, the stage 400 moves back to its original position after the reflow process performed on the batch of the workpieces is finished.

With continued reference to FIG. 7E and further referencing FIG. 10, when the reflow process is complete, the vacuum generators 510 of the vacuum modules (500A and 500B) may be turned off. For example, the vacuum pressure gradually returns to the initial pressure $P_0$. In some embodiments, the vacuum pressure increases at a constant rate to reach the initial pressure $P_0$ at the third phase PS3. Alternatively, at the third phase PS3, the vacuum regulator 530 may be used to control the increase of vacuum pressure in a smooth manner.

Referring to FIG. 7F and also referencing FIG. 1C, the conveyor mechanism 25 and the carrier 15 carrying the workpieces 10" that have been reflowed may move forward as indicated by the arrow AR1. For example, following release from the stage 400, the workpieces 10" that have been reflowed may be transferred to be unloaded from the carrier 15 and/or may be transferred to next station. In some embodiments, a dispensing process is performed on the workpieces 10" that have been reflowed to form the underfill UF (labeled in FIG. 1C) covering the conductive joints CJ. Although other processing may be possible depending on product requirements. In some embodiments, during the workpieces 10" that have been reflowed are transferred, the stage 400 may remain heated to perform the reflow process on the following batch. Alternatively, the heating source HT built in the stage 400 may be turned off once the reflow process is complete.

In accordance with some embodiments, a system for reflowing a semiconductor workpiece is provided. The system includes a stage, a first vacuum module and a second vacuum module, and an energy source. The stage includes a base and a protrusion connected to the base, the stage is movable along a height direction of the stage relative to the semiconductor workpiece, the protrusion operably holds and heats the semiconductor workpiece, and the protrusion includes a first portion and a second portion surrounded by and spatially separated from the first portion. The first vacuum module and the second vacuum module respectively coupled to the first portion and the second portion of the protrusion, and the first vacuum module and the second vacuum module are operable to respectively apply a pressure to the first portion and the second portion. The energy source is disposed over the stage to heat the semiconductor workpiece held by the protrusion of the stage.

In accordance with some embodiments, a method of processing a semiconductor workpiece at least includes the following steps. A semiconductor workpiece is moved to be positioned between an energy source and a protrusion of a stage, where the protrusion includes a first portion and a second portion encircled by the first portion. The stage is moved to be in contact with a bottom surface of the semiconductor workpiece. The first portion and the second portion of the protrusion are vacuumed in a sequential manner to respectively apply a vacuum pressure to each region of the bottom surface of the semiconductor workpiece corresponding to one of the first portion and the second portion. The semiconductor workpiece is reflowed during the vacuuming.

In accordance with some embodiments, a method of bonding package components includes at least the following steps. A carrier that carries a plurality of semiconductor workpieces is positioned over a stage, where each of the plurality of semiconductor workpieces includes a first package component and a second package component placed on the first package component. A plurality of protrusions of a stage is abutted against the plurality of semiconductor workpieces with a one-to-one correspondence, where the plurality of protrusions pass through the carrier to be in contact with bottom surfaces of the first package components of the plurality of semiconductor workpieces. The plurality of protrusions of the stage is vacuumed to change warpage profiles of the plurality of semiconductor workpieces. A temperature of each of the plurality of semiconductor workpieces is risen to form conductive joints bonding the second package component to the first package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for reflowing a semiconductor workpiece, comprising:

a stage comprising a base and a protrusion connected to the base, the protrusion comprising a first portion, a second portion surrounded by and spatially separated from the first portion and a spacer encircling the second portion to separate the second portion from the first portion, and a material of the spacer is different from materials of the first portion and the second portion;

a first vacuum module and a second vacuum module respectively coupled to the first portion and the second portion of the protrusion; and an energy source disposed over the stage to heat the semiconductor workpiece held by the protrusion of the stage.

2. The system of claim 1, wherein each of the first vacuum module and the second vacuum module comprises:

a vacuum regulator operably coupled to the protrusion to respectively regulate a pressure respectively applied by the first vacuum module and the second vacuum module to the first portion and the second portion.

3. The system of claim 1, wherein each of the first vacuum module and the second vacuum module comprises:

a sensor operably coupled to the protrusion to detect an abnormal condition of the protrusion.

4. The system of claim 1, wherein the semiconductor workpiece comprises a first package component and a second package component placed on the first package component, a carrying surface of the protrusion of the stage is in contact with a bottom surface of the first package component, and a surface area of the carrying surface the protrusion is substantially less than a surface area of the bottom surface of the first package component.

5. The system of claim 4, wherein the first package component and the second package component of the semiconductor workpiece vertically overlap the second portion of the protrusion of the stage.

6. The system of claim 1, wherein the material of the first portion is the same as the material of the second portion.

7. The system of claim 1, further comprising:

a conveyor mechanism extending across the stage to transfer the semiconductor workpiece, wherein the protrusion of the stage is movable along a height direction of the stage to pass through the conveyor mechanism to be in contact with the semiconductor workpiece.

8. A system for reflowing a semiconductor workpiece, comprising:

a stage, comprising:

a base; and a plurality of protrusions, connected to the base and each comprising a first portion and a second portion surrounded by and spatially separated from the first portion;

a plurality of first vacuum modules, coupled to the first portions comprised in the plurality of protrusions;

a plurality of second vacuum modules, coupled to the second portions comprised in the plurality of protrusions;

an energy source, disposed over the stage to heat the semiconductor workpiece in contact with a respective one of the plurality of protrusions of the stage; and at least one carrier, disposed between the stage and the energy source, wherein the at least one carrier is configured to hold the semiconductor workpiece in a proper position so to be in contact with the respective one of the plurality of protrusions of the stage, wherein the at least one carrier is disposed between the stage and the semiconductor workpiece.

9. The system of claim 8, wherein the at least one carrier comprises a plurality of hollow regions penetrating through the at least one carrier, wherein in a top view along a stacking direction of the stage and the energy source, an edge of each of the plurality of protrusions are distant from a sidewall of a respective one of the plurality of hollow regions.

10. The system of claim 9, wherein the semiconductor workpiece is disposed on the at least one carrier and overlapped with a respective one of the plurality of hollow regions, and the respective one of the plurality of hollow regions is disposed between the base and the semiconductor workpiece.

11. The system of claim 8, wherein the at least one carrier comprises a plurality of carriers, wherein the plurality of carriers are spacing separated from one another.

12. The system of claim 8, wherein the energy source comprises a radiation source.

13. The system of claim 8, wherein the stage further comprises a heat source.

14. The system of claim 8, further comprising:

an operating device, coupled to the stage, the plurality of first vacuum modules, and the plurality of second vacuum modules to controllably operating thereto.

15. A system for reflowing a semiconductor workpiece, comprising:

a stage, comprising:

a base; and a protrusion, disposed on the base and comprising:

an inner portion;

an outer ring portion, enclosed the inner portion;

a spacer, interposing between the inner portion and the outer ring portion; and a protection portion; laterally covering the outer ring portion, wherein an area of the protrusion is less than an area of the semiconductor workpiece in a top view along a stacking direction of the base and the protrusion;

a first vacuum module, coupled to the inner portion;

a second vacuum module, coupled to the outer ring portion;

an energy source, disposed over the stage to heat the semiconductor workpiece placed over the protrusion;

a conveyor mechanism, disposed between the stage and the energy source; and an operating device, disposed underneath the conveyor mechanism and coupled to the stage, the first vacuum module, and the second vacuum module to controllably operating thereto.

16. The system of claim 15, wherein the base comprises a non-porous material.

17. The system of claim 15, wherein the inner portion of the protrusion comprises a first porous material, the outer ring portion of the protrusion comprises a second porous material, the spacer of the protrusion comprises a first non-porous material, and the protection portion of the protrusion comprises a second non-porous material.

18. The system of claim 17, wherein the first porous material is different from the second porous material.

19. The system of claim 15, wherein the energy source comprises a radiation source.

20. The system of claim 15, wherein the stage further comprises a heat source.

\* \* \* \* \*